US008890265B2

(12) United States Patent
Kuratani

(10) Patent No.: US 8,890,265 B2
(45) Date of Patent: Nov. 18, 2014

(54) SEMICONDUCTOR DEVICE AND MICROPHONE

(75) Inventor: Naoto Kuratani, Kameoka (JP)

(73) Assignee: OMRON Corporation, Kyoto-Shi (JP)

( * ) Notice: Subject to any disclaimer, the term of this patent is extended or adjusted under 35 U.S.C. 154(b) by 0 days.

(21) Appl. No.: 14/113,053

(22) PCT Filed: Aug. 29, 2012

(86) PCT No.: PCT/JP2012/071801
§ 371 (c)(1),
(2), (4) Date: Nov. 12, 2013

(87) PCT Pub. No.: WO2013/035596
PCT Pub. Date: Mar. 14, 2013

(65) Prior Publication Data
US 2014/0183671 A1 Jul. 3, 2014

(30) Foreign Application Priority Data

Sep. 9, 2011 (JP) ................. 2011-197288

(51) Int. Cl.
H01L 29/84 (2006.01)
H01L 23/04 (2006.01)
B81B 7/00 (2006.01)
H01L 23/552 (2006.01)
H04R 19/04 (2006.01)
H01L 23/00 (2006.01)
H04R 19/00 (2006.01)

(52) U.S. Cl.
CPC .............. *B81B 7/0064* (2013.01); *H04R 19/04* (2013.01); *H01L 24/32* (2013.01);
(Continued)

(58) Field of Classification Search
USPC ................. 257/416, 422, 428, 659, 704, 723, 257/E31.001, E27.118; 381/92, 355
See application file for complete search history.

(56) References Cited

FOREIGN PATENT DOCUMENTS

JP 2005-340961 A 12/2005
JP 2006-211468 A 8/2006
(Continued)

OTHER PUBLICATIONS

Japanese Office Action for Application No. 2011-197288, issued Oct. 9, 2012. (4 pages).

(Continued)

*Primary Examiner* — Tan N Tran
(74) *Attorney, Agent, or Firm* — Nutter McClennen & Fish LLP; John J. Penny, Jr.; Michael P. Visconti, III

(57) ABSTRACT

A package is formed by vertically stacking a cover and a substrate. A microphone chip is mounted at the top surface of a concave portion provided to the cover, and a circuit element is mounted on the upper surface of the substrate. The microphone chip is connected to a pad on the lower surface of the cover by a bonding wire. The circuit element is connected to a pad on the upper surface of the substrate by a bonding wire. A cover-side joining portion in conduction with the pad on the lower surface of the cover, and a substrate-side joining portion in conduction with the pad on the upper surface of the substrate, are joined by a conductive material. A conductive layer for electromagnetic shielding is embedded inside the cover near the bonding pad and the cover-side joining portion.

7 Claims, 26 Drawing Sheets

(52) U.S. Cl.
CPC ............... *H01L 2224/49175* (2013.01); *H01L 2924/1433* (2013.01); *H01L 24/48* (2013.01); *H01L 23/04* (2013.01); *H01L 2224/13144* (2013.01); *H01L 24/73* (2013.01); *H01L 2924/1461* (2013.01); *H01L 2224/48227* (2013.01); *H01L 2224/32225* (2013.01); *H01L 2924/12041* (2013.01); *H01L 2924/3011* (2013.01); *H01L 2924/14* (2013.01); *H01L 24/13* (2013.01); *H01L 24/49* (2013.01); *H01L 24/16* (2013.01); *H01L 2924/15153* (2013.01); *H01L 2224/73265* (2013.01); *H04R 19/005* (2013.01); *H01L 2224/73204* (2013.01); *H01L 2924/16151* (2013.01); *H01L 23/552* (2013.01); *H01L 2224/16227* (2013.01)

USPC ........... 257/416; 257/422; 257/428; 257/659; 257/704; 257/723; 381/92; 381/355

(56) References Cited

FOREIGN PATENT DOCUMENTS

| | | |
|---|---|---|
| JP | 2008-099271 A | 4/2008 |
| JP | 2009-289924 A | 12/2009 |
| JP | 2011-188330 A | 9/2011 |
| JP | 2011-254192 A | 12/2011 |

OTHER PUBLICATIONS

International Search Report for Application No. PCT/JP12/71801, issued Oct. 16 2012. (4 pages).

SEMICONDUCTOR DEVICE AND MICROPHONE

CROSS REFERENCE TO RELATED APPLICATIONS

This application claims priority to Japanese Patent Application No. 2011-197288 filed on Sep. 9, 2011, and International Application No. PCT/JP2012/071801 filed 29 Aug. 2012 and designating the United States, the entire contents of which are incorporated by reference herein.

TECHNICAL FIELD

The invention relates to a semiconductor device and a microphone, and particularly to a semiconductor device for accommodating a semiconductor element inside a package. It also relates to a microphone for accommodating a microphone chip (an acoustic sensor) inside a package.

BACKGROUND

According to a microphone including a microphone chip and a circuit element, the microphone chip and the circuit element are connected by a high-impedance wiring. However, in a case that a high-impedance wiring is used, noise is likely to be picked up by the wiring. When noise is picked up by the wiring, the noise is added to the signal transmitted from the microphone chip to the circuit element, and the signal-noise (S/N) ratio of a detection signal becomes poorer. Thus, the microphone is desirably structured such that noise is not picked up by a wiring portion connecting the microphone chip and the circuit element as much as possible.

A microphone accommodating a microphone chip and a circuit element inside a package is described in Japanese Unexamined Patent Publication No. 2006-211468 (Patent Document 1). FIG. 1 is a cross-sectional diagram of a microphone 11 (a package module) described in Patent Document 1. With this microphone 11, a microphone chip 12 and a circuit element 13 are bonded next to each other on the upper surface of a printed wiring board 14, and a cover 15 placed on the upper surface of the printed wiring board 14 covers the microphone chip 12 and the circuit element 13. The microphone chip 12 is connected to the printed wiring board 14 by a solder ball 16 provided on the lower surface and a penetrating electrode 17 penetrating through the top and bottom of the microphone chip 12. Also, the circuit element 13 is connected to the printed wiring board 14 by a solder ball 18 provided on the lower surface. Moreover, the microphone chip 12 and the circuit element 13 are connected by a pattern wiring provided to the printed wiring board 14.

According to the structure of the microphone 11 of Patent Document 1, the pattern wiring connecting the microphone chip 12 and the circuit element 13 is provided on the upper surface of the printed wiring board 14, and is surrounded by a package formed from the printed wiring board 14 and the cover 15. Thus, if a ground conductor is provided to the entire printed wiring board 14 and the cover 15, the influence of external noise is not likely to be received.

Furthermore, according to a microphone 21 shown in FIG. 2, a microphone chip 12 and a circuit element 13 are mounted, next to each other, on the lower surface of a cover 15, and a printed wiring board 14 is joined below the cover 15. With this microphone 21, the microphone chip 12 and the circuit element 13 are connected by a high-impedance bonding wire 22. The circuit element 13 is connected to a bonding pad 24 provided on the lower surface of the cover 15 by a low-impedance bonding wire 23, and the bonding pad 24 is joined to a connection pad 25 of the printed wiring board 14 by conductive resin 26. A hatched layer in FIG. 2 is a ground conductor 27 connected to the ground. Such a microphone may be a microphone described in Japanese Patent Application No. 2010-52643 as filed by the applicant, for example).

With the microphone 21 having the structure as shown in FIG. 2, the microphone chip 12 and the circuit element 13 are directly connected by the bonding wire 22. Accordingly, the high-impedance bonding wire 22 which easily picks up noise is surrounded by the ground conductor 27 of the package, and is not particularly affected by the noise from outside. Also, the bonding wire 23 for connecting the circuit element 13 to the printed wiring board 14 is partially positioned near the surface of the package, and is not covered by the ground conductor 27 near the joined portion of the bonding pad 24 and the connection pad 25 with respect to some directions. That is, noise may come from upper oblique side of the microphone 21 to the bonding wire 23. However, since the impedance of the bonding wire 23 is low, it does not easily pick up noise, and noise does not particularly become an issue.

The applicant filed Japanese Patent Application No. 2010-125527 for a microphone whereby a microphone chip and a circuit element are vertically placed to reduce the mounting area at the time of mounting of the microphone to a circuit board or the like by mounting one of the microphone chip and the circuit element on the substrate and the other on a cover. FIG. 3 shows an example of such a microphone.

According to a microphone 31 shown in FIG. 3, a microphone chip 12 is mounted inside a concave portion of a cover 15, and a bonding pad 24 provided on the lower surface of the cover 15 and the microphone chip 12 are connected by a bonding wire 22. Also, a circuit element 13 is mounted on the upper surface of the printed wiring board 14, and a connection pad 25 provided on the upper surface of the printed wiring board 14 and the circuit element 13 are connected by a pattern wiring provided on the upper surface of the printed wiring board 14. The cover 15 is fixed on the upper surface of the printed wiring board 14 by joining the bonding pad 24, the connection pad 25 and the like by conductive resin 26. As a result, the microphone chip 12 and the circuit element 13 are electrically connected via the bonding wire 22, the bonding pad 24, the conductive resin 26, the connection pad 25, and the pattern wiring of the printed wiring board 14.

In the case of the microphone 31 in FIG. 3, the bonding wire 22, which is a part of the wiring connecting the microphone chip 12 to the circuit element 13, is partially positioned near the surface of the package, and is not covered by a ground conductor 27 (hatched in FIG. 3) near the joined portion of the bonding pad 24 and the connection pad 25 with respect to some directions. That is, if, as shown in FIG. 3, noise N comes from the diagonally upward side of the microphone 31 to the bonding wire 22, the bonding pad 24 possibly picks up the noise by the bonding wire 22. Moreover, since the bonding wire 22 is a high-impedance wiring, such a microphone 31 has a structure susceptible to external noise.

Additionally, to improve the noise immunity of such a microphone 31, at least the lower portion of the outer peripheral surface of the cover 15 is covered by a conductive layer, and the conductive layer is connected to the ground. However, in the fabrication process of the microphone 31, a large number of microphones are integrally fabricated at the same time, and separate microphones are obtained by cutting in the final step, and the outer peripheral surface of the microphone 31 is the cutting surface in the fabrication process. Thus, if a conductive layer is to be formed on the outer peripheral surface of the microphone 31, the conductive layer has to be added separately to each microphone 31 which has been cut, and there is a problem that the production yield of the microphone 31 is reduced.

As described above, external noise is not particularly an issue in the case a microphone chip and a circuit element are mounted, next to each other, on a substrate or a cover. However, as shown in FIG. 3, with a microphone where a microphone chip and a circuit element are vertically placed by separately mounting the microphone chip and the circuit element on the substrate side and the cover side and joining the cover on the substrate, the influence of external noise is great. Particularly, the influence of external noise is great with a structure in which the microphone chip and the circuit element are electrically connected via pad portions provided to the cover and the substrate. Such an inconvenience is present not only for a microphone, but also for a semiconductor device having a similar assembly structure.

In view of the technical problem described above, it is desired to reduce the influence of external noise and to improve the noise immunity of a semiconductor device according to which a semiconductor element such as a microphone chip and the like and a circuit element are vertically placed.

SUMMARY

Disclosed is a semiconductor device including a package formed from a first member and a second member, the package having a concave portion formed on an inner surface of at least one member of the first member and the second member, a sensor mounted on an inner surface of the first member, a circuit element mounted on an inner surface of the second member, and electrical connection means configured to electrically connect the sensor and the circuit element through a joining portion of the first member and the second member, wherein a conductive layer for electromagnetic shielding is provided near a part, of the joining portion of the first member and the second member through which the electrical connection means is passed. Additionally, the term "joining portion" in the specification and the claims includes not only the region where the first member and the second member are directly joined, but also its peripheral region.

DETAILED DESCRIPTION

Hereinafter, preferred embodiments of the invention will be described with reference to the accompanying drawings.

However, the invention is not restricted to the following embodiments, and various modifications in design can be made without departing from the scope of the invention.

Figure 4:
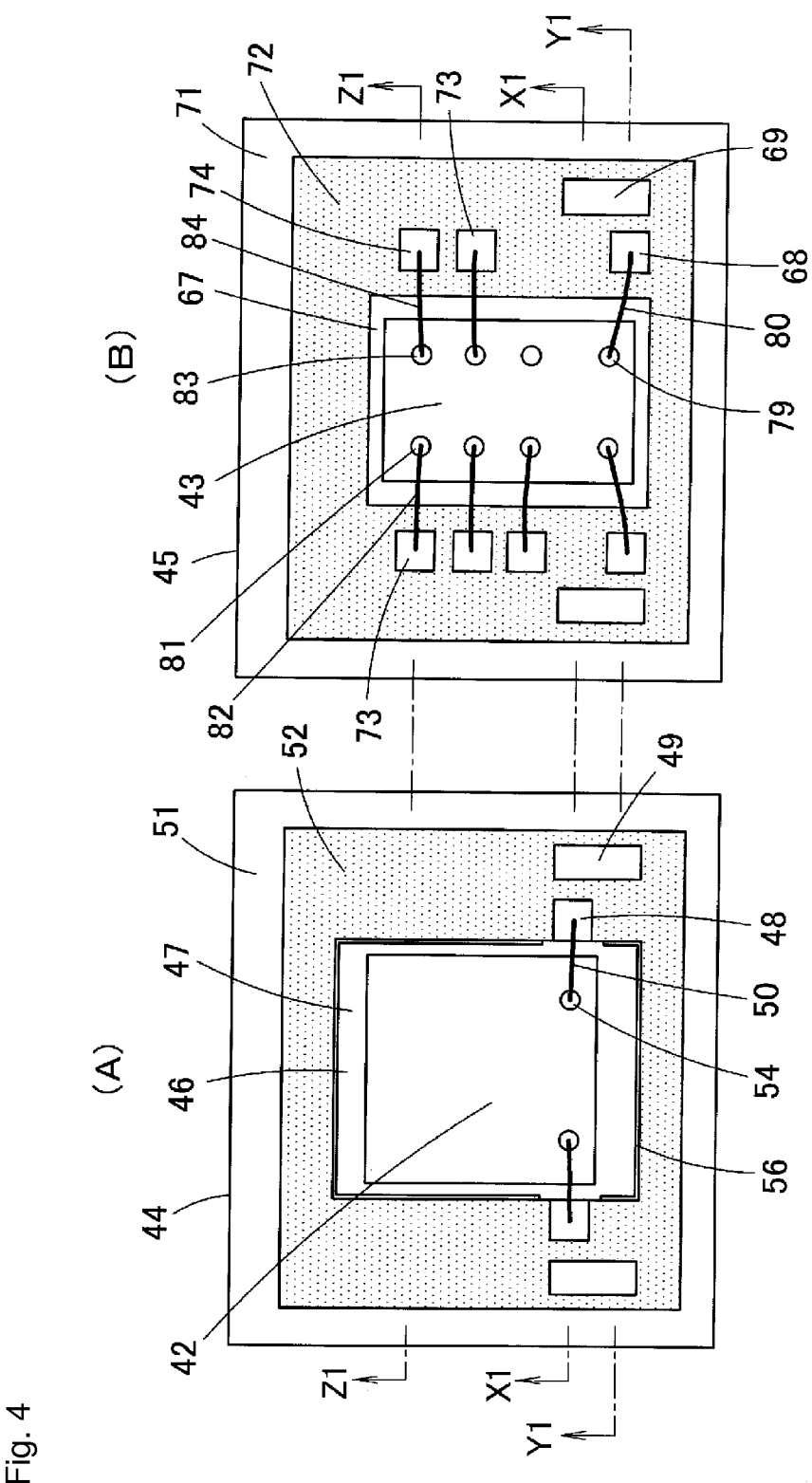
FIG. 4(A) is a bottom view of a cover on which a microphone chip according to First Embodiment is mounted.
FIG. 4(B) is a plan view of a substrate on which a circuit element according to an embodiment is mounted.
Figure 5:
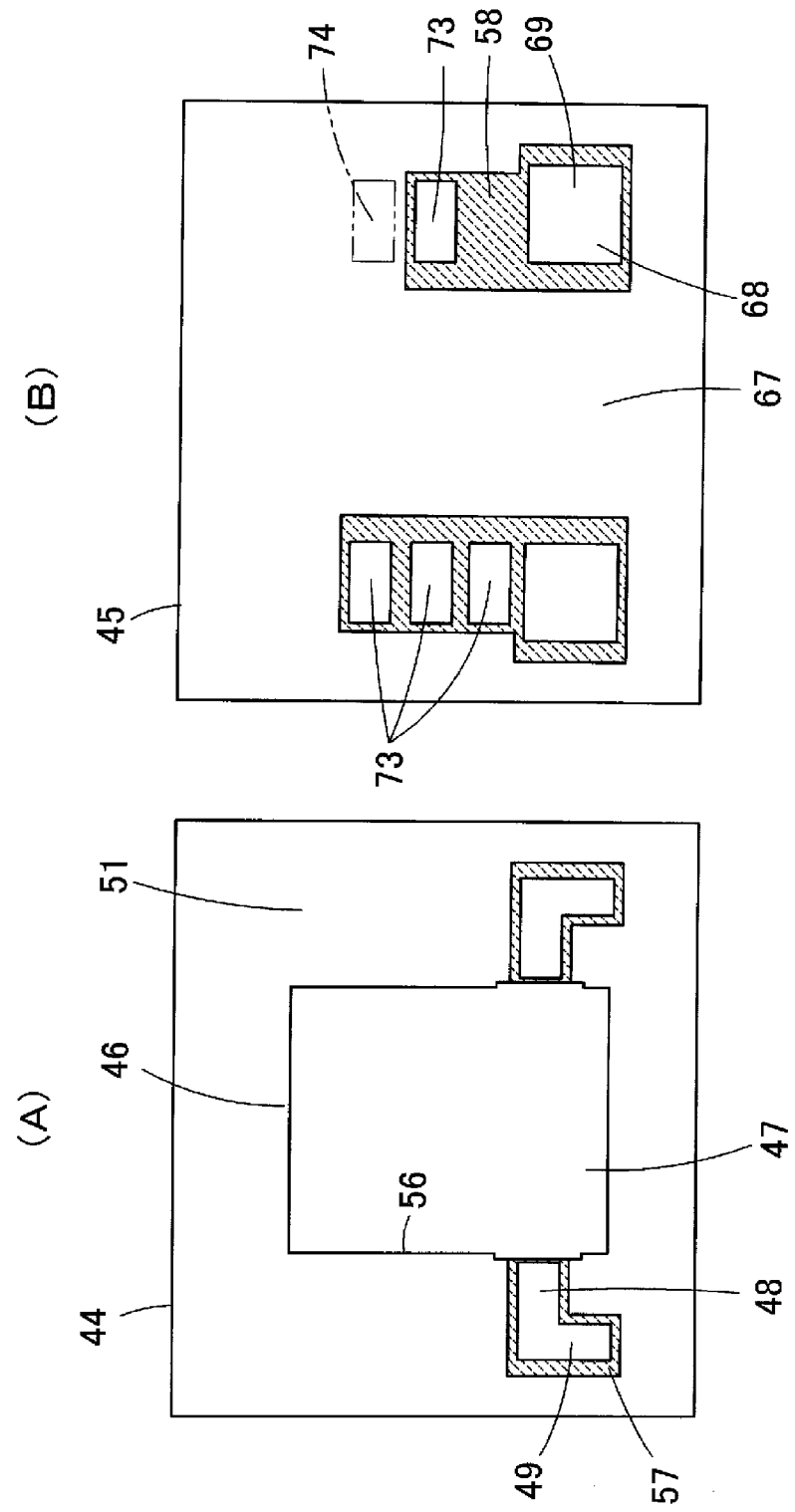
FIG. 5(A) is a bottom view of the cover of FIG. 4(A) from which a solder resist has been removed.
FIG. 5(B) is a plan view of the substrate according to an embodiment from which a solder resist has been removed.
Figure 6:
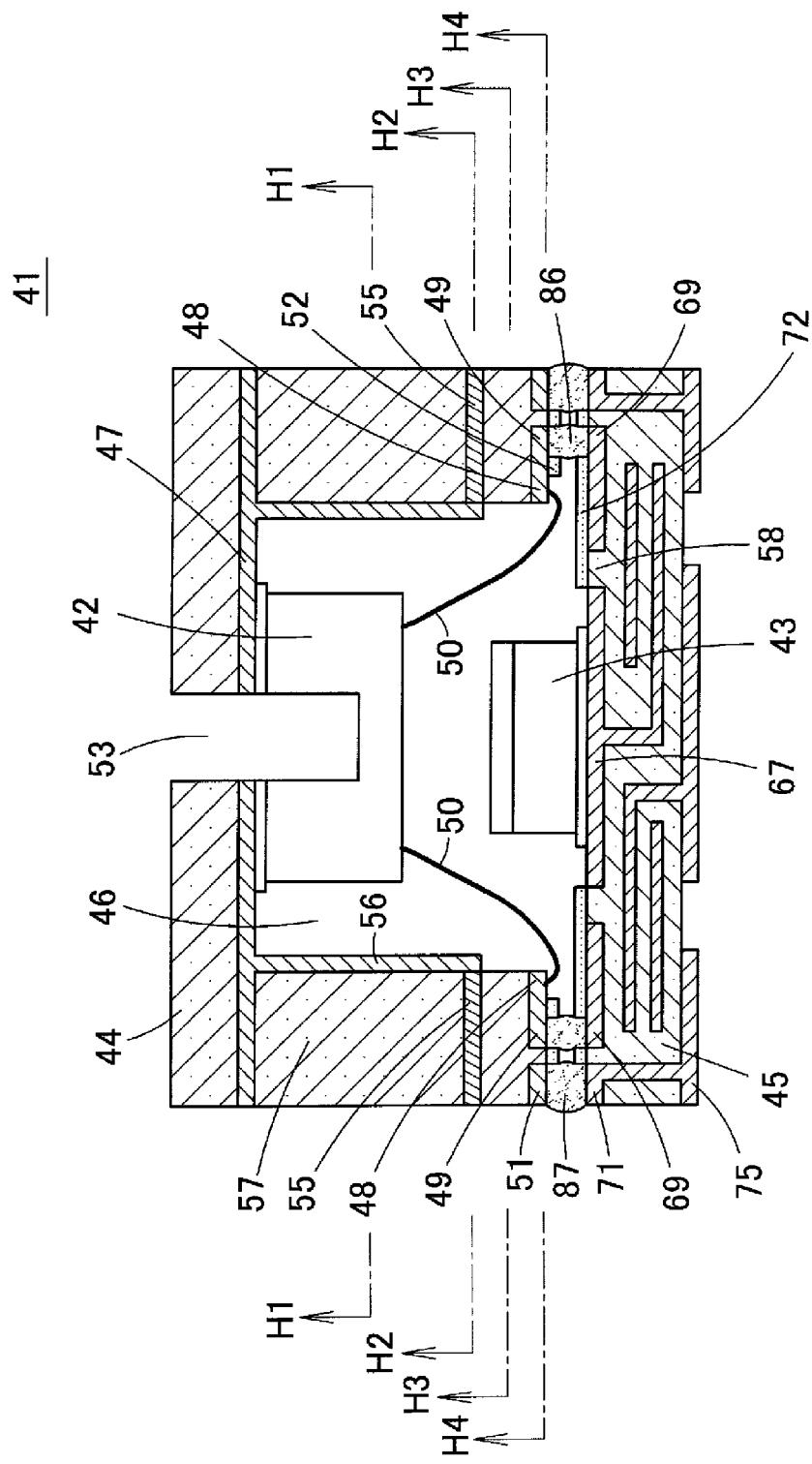
FIG. 6 is a cross-sectional diagram of a microphone of an embodiment, and shows a cross section at a portion corresponding to line X1-X1 in FIGS. 4(A) and 4(B)
Figure 7:
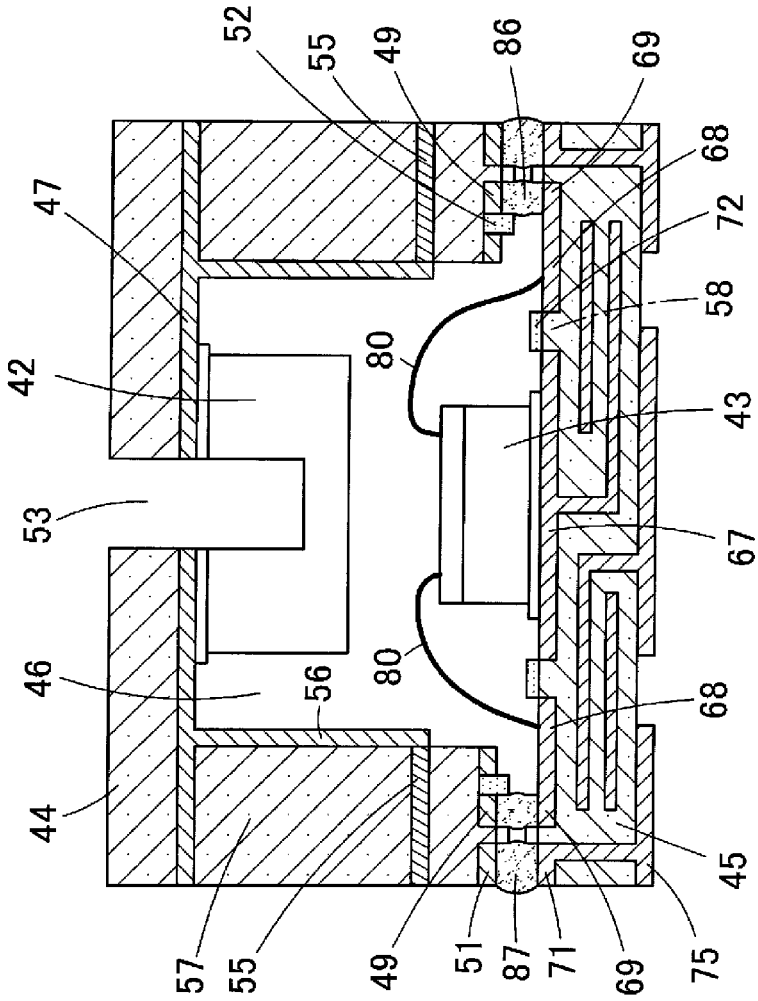
FIG. 7 is a cross-sectional diagram of the microphone of FIG. 6, and shows a cross section at a portion corresponding to line Y1-Y1 in FIGS. 4(A) and 4(B)
Figure 8:
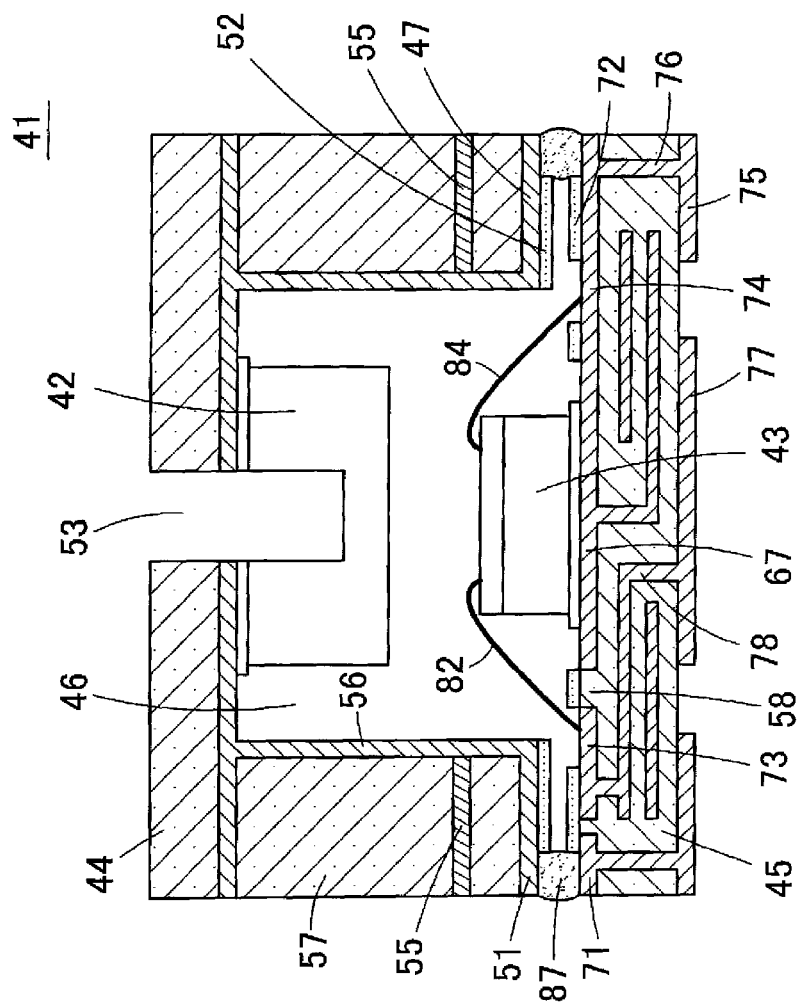
FIG. 8 is a cross-sectional diagram of the microphone of FIG. 6, and shows a cross section at a portion corresponding to line Z1-Z1 in FIGS. 4(A) and 4(B)
Figure 9:
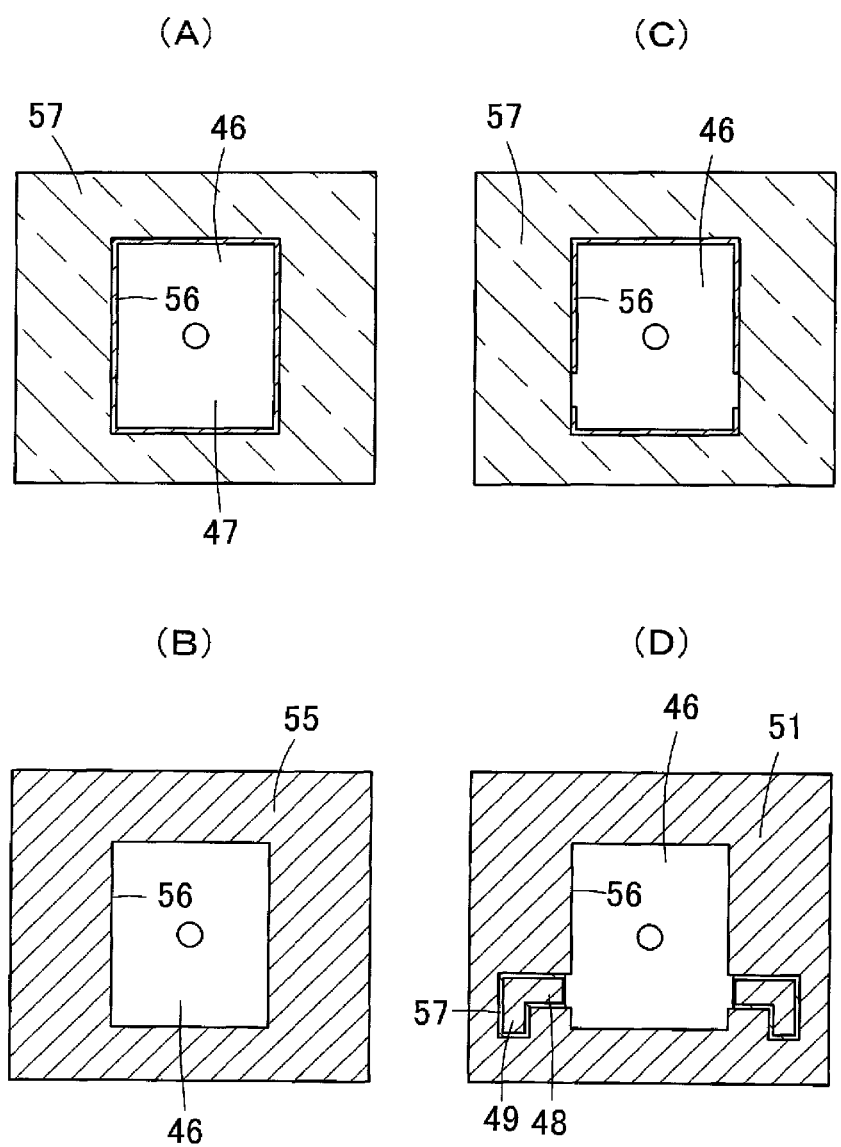
FIG. 9(A) is a cross-sectional diagram of the cover along line H1-H1 in FIG. 6.
FIG. 9(B) is a cross-sectional diagram of the cover along line H2-H2 in FIG. 6.
FIG. 9(C) is a cross-sectional diagram of the cover along line H3-H3 in FIG. 6.
FIG. 9(D) is a cross-sectional diagram of the cover along line H4-H4 in FIG. 6.
Figure 10:
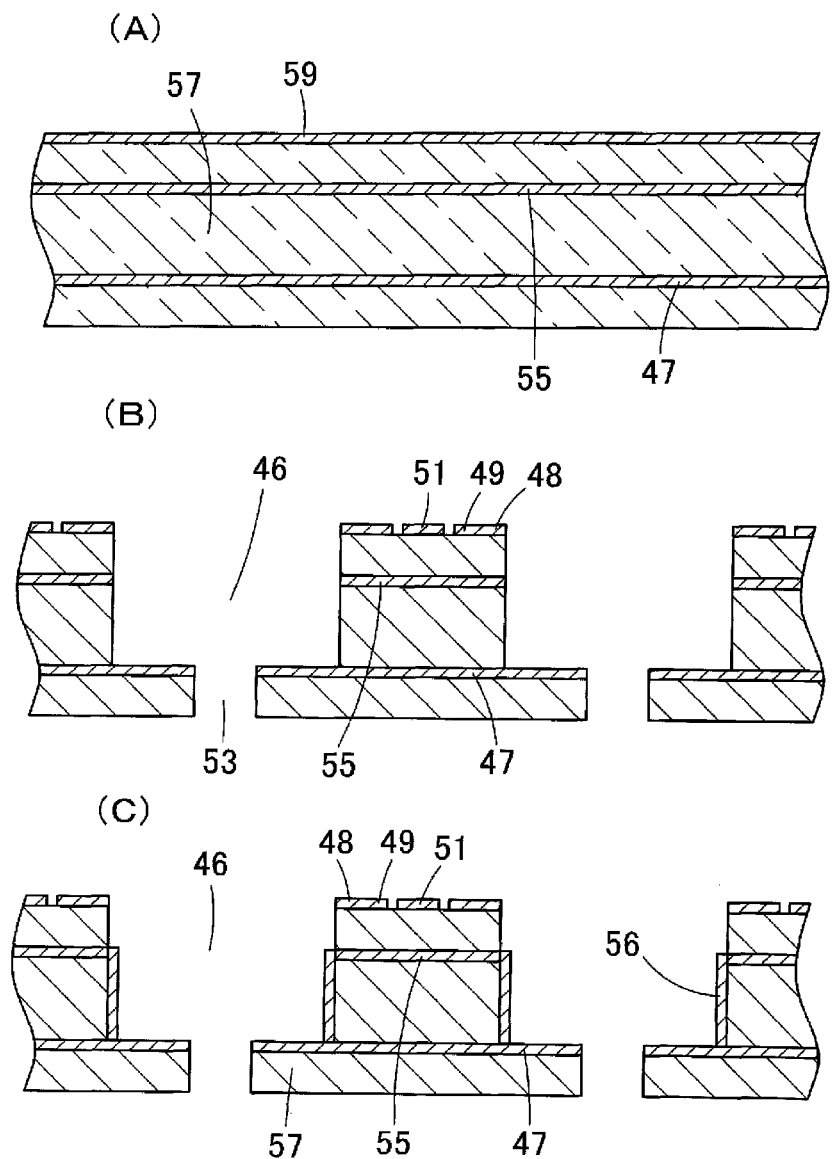
FIGS. 10(A) to 10(C) are schematic diagrams for describing a fabrication process of the cover.

A top-port microphone 41 according to an embodiment will be described with reference to FIGS. 4(A) and 4(B) to FIGS. 10(A) to 10(C). The microphone 41 is a MEMS microphone that is fabricated by MEMS technique, and accommodates a microphone chip 42 (a sensor) and a circuit element 43 inside a package formed from a cover 44 (a first member) and a substrate 45 (a second member). Also, the microphone 41 is a top-port type with an acoustic perforation 53 provided on the cover 44. FIG. 4(A) is a bottom view of the cover 44 on which the microphone chip 42 is mounted, and FIG. 4(B) is a plan view of the substrate 45 on which the circuit element 43 is mounted. FIG. 5(A) is a bottom view of the cover 44 from which a solder resist has been removed, and FIG. 5(B) is a plan view of the substrate 45 from which a solder resist has been removed. Also, FIG. 6 is a cross-sectional diagram of the microphone 41 at a portion corresponding to line X1-X1 in FIGS. 4(A) and 4(B). FIG. 7 is a cross-sectional diagram of the microphone 41 at a portion corresponding to line Y1-Y1 in FIGS. 4(A) and 4(B). FIG. 8 is a cross-sectional diagram of the microphone 41 at a portion corresponding to line Z1-Z1 in FIGS. 4(A) and 4(B). FIG. 9(A) is a cross-sectional diagram of the cover along line H1-H1 in FIG. 6, FIG. 9(B) is a cross-sectional diagram of the cover along line H2-H2 in FIG. 6, FIG. 9(C) is a cross-sectional diagram of the cover along line H3-H3 in FIG. 6, and FIG. 9(D) is a cross-sectional diagram of the cover along line H4-H4 in FIG. 6. FIGS. 10(A) to 10(D) are schematic diagrams for describing a fabrication process of the cover.

The cover 44 is a multilayer wiring board, a copper clad laminate, a glass epoxy substrate, a ceramic substrate, a plastic substrate, a metal substrate, a carbon nanotube substrate, or a composite substrate formed from the above comprising two layers of metallic foils (conductive layers 47, 55) on the inside, and one layer of metallic foil (a layer to be a bonding pad 48, a cover side joining portion 49, and a ground joining portion 51) on the lower surface (see FIGS. 10(A) to 10(C)). Alternatively, three glass epoxy substrates or copper clad laminates that are stacked and integrated, with a metallic foil placed on the surface, may also be used. Parts of the cover 44 other than the metallic foil are of an insulating material 57. Also, the cover 44 may be formed of ceramic or plastic, two layers of metal plates (conductive layers 47, 55) may be embedded inside, and one metal plate (a layer to be the bonding pad 48, the cover side joining portion 49, and the ground joining portion 51) may be adhered to the surface.

As shown in FIGS. 6 to 8, a box-shaped concave portion 46 for accommodating a microphone chip 42 is provided at the center portion of the lower surface of the cover 44. A metallic foil at the top, that is, the conductive layer 47 (a first conductive layer) is exposed at the top surface of the concave portion 46, and the outer peripheral portion of the conductive layer 47 is horizontally sandwiched inside the cover 44. A metallic foil in the middle, that is, the conductive layer 55 for electromagnetic shielding, is horizontally sandwiched inside the wall of the cover 44 at a position near the lower surface of the cover 44. A metallic foil positioned at the lower surface of the cover 44 is separated, as shown in FIG. 5(A), into the bonding pad 48 (a first bonding pad) and the cover-side joining portion 49, and other parts, that is, the ground joining portion 51. As shown in FIGS. 6 to 8, and 9(A) to 9(D), a conductive layer 56 (a second conductive layer) is vertically formed to the inner peripheral wall surface of the concave portion 46 in such a way as to be in conduction with the conductive layer 47, the conductive layer 55 and the ground joining portion 51, and an electromagnetic shield portion (a ground portion) is configured by the conductive layers 47, 55 and 56, and the ground joining portion 51.

As shown in FIG. 4(A), the outside of the concave portion 46, that is, the lower surface of the cover 44, is covered by a solder resist 52, and a plurality of bonding pads 48 and cover-side joining portions 49 (sensor-side joining portions) are provided on the lower surface of the cover 44 in such a way as to be exposed from the solder resist 52. Furthermore, the outer peripheral portion of the ground joining portion 51 is also exposed from the solder resist 52.

The ground joining portion 51, the bonding pad 48, and the cover-side joining portion 49 are one layer of metallic foil, but as shown in FIG. 5(A), the peripheries of the bonding pad 48 and the cover-side joining portion 49 are separated from the ground joining portion 51, and each of the bonding pad 48 and the cover-side joining portion 49 is electrically insulated from the ground joining portion 51. On the other hand, as shown in FIG. 5(A), the bonding pad 48 and the cover-side joining portion 49 are in electrical conduction with each other below the solder resist 52. Additionally, the hatched portions in FIG. 5(A) are portions of the cover 44 where a metal film is removed and the insulating material 57 is exposed.

The microphone chip 42 is an MEMS element (an acoustic sensor), and a thin-film diaphragm for acoustic vibration detection is provided to an opening of an Si substrate, and a canopy-shaped back plate is fixed to the Si substrate, facing the diaphragm, for example. Also, a capacitor for outputting detection signals is configured from a fixed electrode film provided to the back plate and the diaphragm (both are formed of polysilicon), and a large number of acoustic holes for introducing acoustic vibration into an air gap between the fixed electrode film and the diaphragm are provided on the back plate.

As shown in FIGS. 6 to 8, the microphone chip 42 is accommodated inside the concave portion 46, and its underside is fixed to the top surface of the concave portion 46 (the conductive layer 47) by an adhesive. Also, the microphone chip 42 is installed in alignment with an acoustic perforation 53 provided on the cover 44, and covers the acoustic perforation 53. Accordingly, the microphone chip 42 may have a large back chamber capacity with the opening portion of the Si substrate and the acoustic perforation 53 being a front chamber and the space inside the package being a back chamber, and the sensitivity of the microphone chip 42 can be increased. As shown in FIGS. 4(A) and 6, a terminal 54 provided on the surface of the microphone chip 42 is connected to the bonding pad 48 by a bonding wire 50 (a first wiring).

As shown in FIGS. 6 to 8, the substrate 45 is a multilayer wiring board, a copper clad laminate, a glass epoxy substrate, a ceramic substrate, a plastic substrate, a metal substrate, a carbon nanotube substrate, or a composite substrate formed from the above. A conductive layer 67 for electromagnetic shielding is formed on almost the entire substrate 45.

As shown in FIG. 4(B), a region, on the upper surface of the substrate 45, other than a circuit element mounted region and the outer peripheral portion is covered by a solder resist 72, and a plurality of bonding pads 68 (second bonding pads), bonding pads 73 and 74, and substrate-side joining portions 69 (circuit element-side joining portions) are provided on the upper surface of the substrate 45 in such a way as to be exposed from the solder resist 72. Also, the outer peripheral portion of the conductive layer 67 exposed from the solder resist 72 is a ground joining portion 71. Here, the bonding pad 68 is a pad for connecting the circuit element 43 to the microphone chip 42, the bonding pad 73 is a pad for connecting the circuit element 43 to a signal input/output terminal 77 on the lower surface (see FIG. 8), and the bonding pad 74 is a pad for ground connection.

The conductive layer 67, the bonding pads 68, 73 and 74, and the substrate-side joining portion 69 are metal films, and as shown in FIG. 5(B), the surroundings of the bonding pads 68, the substrate-side joining portions 69, and the bonding pads 73 are separated from the conductive layer 67, and the bonding pads 68, the substrate-side joining portions 69 and the bonding pads 73 are each electrically insulated from the conductive layer 67. On the other hand, as shown in FIG. 5(B), the bonding pad 68 and the substrate-side joining portion 69 are in electrical conduction with each other below the solder resist 72. Also, the bonding pad 74 is a part of the conductive layer 67, and is in conduction with the ground joining portion 71. Additionally, the hatched portions in FIG. 5(B) are portions of the substrate 45 where the metal film is removed and an insulating material 58 is exposed.

A ground terminal 75 is provided on the lower surface of the substrate 45, and the ground terminal 75 is linked to the conductive layer 67 through a via hole 76. Accordingly, a ground terminal 83 of the circuit element 43 is in conduction with the ground terminal 75 through the via hole 76 and the like. Also, the signal input/output terminal 77 for signal input/output is provided on the lower surface of the substrate 45, and the signal input/output terminal 77 is linked to the bonding pad 73 through a via hole 78. Accordingly, a terminal 81 of the circuit element 43 is in conduction with the signal input/output terminal 77 through the via hole 78 and the like.

The circuit element 43 is an element such as an application specific integrated circuit (ASIC) or an integrated circuit (IC) chip. As shown in FIGS. 6 to 8, the circuit element 43 is placed on the upper surface of the substrate 45, and its underside is fixed to the upper surface of the substrate 45 by an adhesive.

As shown in FIG. 4(B), a terminal 79 for connecting a microphone chip provided on the upper surface of the circuit element 43 is connected to the bonding pad 68 by a bonding wire 80 (a second wiring). The terminal 81 for signal input/output provided on the surface of the circuit element 43 is connected to the bonding pad 73 by a bonding wire 82. Also, a ground terminal 83 provided on the surface of the circuit element 43 is connected to the bonding pad 74 by a bonding wire 84.

As shown in FIGS. 6 to 8, the cover 44 is stacked on the upper surface of the substrate 45 with the concave portion 46 being on the lower side, and the cover-side joining portion 49 and the substrate-side joining portion 69 facing each other are joined by a conductive material 86. The conductive material 86 that may be used may be any one of a conductive adhesive, solder, a two-sided conductive adhesive tape, and a brazing filler metal for welding, or a plurality of materials among the above may be used in combination. The outer peripheral region of the ground joining portion 51 and the ground joining portion 71 provided at the outer peripheral portion on the upper surface of the substrate 45 are joined along the whole perimeter by a conductive material 87. As the conductive material 87, any one of a conductive adhesive, solder, a two-sided conductive adhesive tape, and a brazing filler metal for welding may be used, or a plurality of materials among the above may be used in combination. Non-conductive resin or a non-conductive tape may further be used in combination to adhere the cover 44 and the substrate 45 to each other.

As a result, the microphone chip 42 and the circuit element 43 are accommodated inside a package formed from the cover 44 and the substrate 45. Also, the conductive layers 47, 55 and 56 and the ground joining portion 51 of the cover 44 are in electrical conduction with the conductive layer 67 of the substrate 45 by the ground joining portion 51 and the ground joining portion 71 being joined by the conductive material 87, and thus, by connecting the ground terminal 75 to an earth line such as a circuit board, the conductive layers 47, 55, 56 and 67, and the ground joining portion 51 are maintained at ground potential, and the microphone 41 is blocked from the external electromagnetic noise.

Since the cover-side joining portion 49 and the substrate-side joining portion 69 are joined via the conductive material 86, the microphone chip 42 is connected to the terminal 79 of the circuit element 43 through the route of the bonding wire 50→the bonding pad 48→the cover-side joining portion 49→the conductive material 86→the substrate-side joining portion 69→the bonding pad 68→the bonding wire 80.

According to the microphone 41 with such a structure, the microphone chip 42 is mounted on the cover 44, the circuit element 43 is mounted on the substrate 45, and the microphone chip 42 is arranged directly above the circuit element 43 in a stacking manner, and thus, a package with a small base area may be used. As a result, the microphone 41 with an extremely small mounting area may be fabricated.

According to this microphone 41, the microphone chip 42 and the circuit element 43 are electrically connected by connecting the bonding wire 50 from the microphone chip 42 to the bonding pad 48 provided on the lower surface of the cover 44, connecting the bonding wire 80 from the circuit element 43 to the bonding pad 68 provided on the upper surface of the substrate 45, and joining the cover-side joining portion 49 and the substrate-side joining portion 69 by the conductive material 86 when joining the cover 44 to the substrate 45. Also, according to this microphone 41, if the cover 44 is turned over such that the bonding pad 48 will be at the top, the bonding pad 48 will be positioned on the surface of the cover 44, and thus, the bonding wire 50 may be easily connected to the bonding pad 48 or the terminal 54 of the microphone chip 42 using a wire bonder. Similarly, since the bonding pad 68 is positioned on the upper surface of the substrate 45, the bonding wire 80 may be easily connected to the bonding pad 68 and the terminal 79 of the circuit element 43 using a wire bonder. Accordingly, with the microphone 41, the microphone chip 42 on the cover 44 and the circuit element 43 on the substrate 45 may be electrically connected by a simple wiring structure and a simple assembly method.

With this microphone 41, the bonding wires 50 and 80 are wirings for connecting the microphone chip 42 and the circuit element 43, and high-impedance wires are used. Moreover, with this microphone 41, to simplify the assembly work, the bonding wire 50 is connected to the bonding pad 48 of the cover 44, and the bonding wire 80 is connected to the bonding pad 68 of the substrate 45, and the bonding wires 50 and 80 are connected to each other via the joined portion of the cover 44 and the substrate 45. Thus, the high-impedance bonding wires 50 and 80 are partially near the surface of the package, and may possibly pick up external noise (see FIG. 3).

However, with the microphone 41, since the conductive layer 55 connected to the ground covers above the bonding pads 48 and 68 to which the bonding wires 50 and 80 are connected, the external noise may be blocked by the conductive layer 55, and the noise immunity of the microphone 41 may be improved at the wiring portion between the microphone chip 42 and the circuit element 43.

Moreover, since the conductive layer 55 is parallel to the conductive layer 47 and the ground joining portion 51, the conductive layer 55 may be embedded in the cover 44 in advance, and the production yield of the microphone 41 is not impaired. That is, FIG. 10(A) shows a parent substrate for fabricating a plurality of covers at the same time, the parent substrate having an area amounting to several pieces of covers. This parent substrate has the conductive layer 47 and the conductive layer 55 sandwiched inside the insulating material 57, and the conductive layer 59 provided on the surface. As shown in FIG. 10(B), the conductive layer 59 is patterned and the bonding pad 48, the cover-side joining portion 49, and the ground joining portion 51 are formed on the surface of the parent substrate, and then, the concave portions 46 are formed at a predetermined pitch on the parent substrate, and the bottom surfaces thereof are penetrated by the acoustic perforations 53. Then, as shown in FIG. 10(C), a plurality of covers 44 with previously embedded conductive layers 55 are fabricated by forming the conductive layers 56 on the inner peripheral surface of the concave portions 46 and conducting the conductive layers 47, the conductive layers 55 and the ground joining portions 51. A plurality of covers 44 may be fabricated and the conductive layers for electromagnetic shielding conductive layers 55 may be collectively provided to the covers 44 by such a process, and the production yield of the microphone 41 is increased.

Furthermore, the conductive layer 55 is preferably of a mesh structure such that the parasitic capacitance between the conductive layer 55 and the bonding pad 48 will be small.

Figure 11:
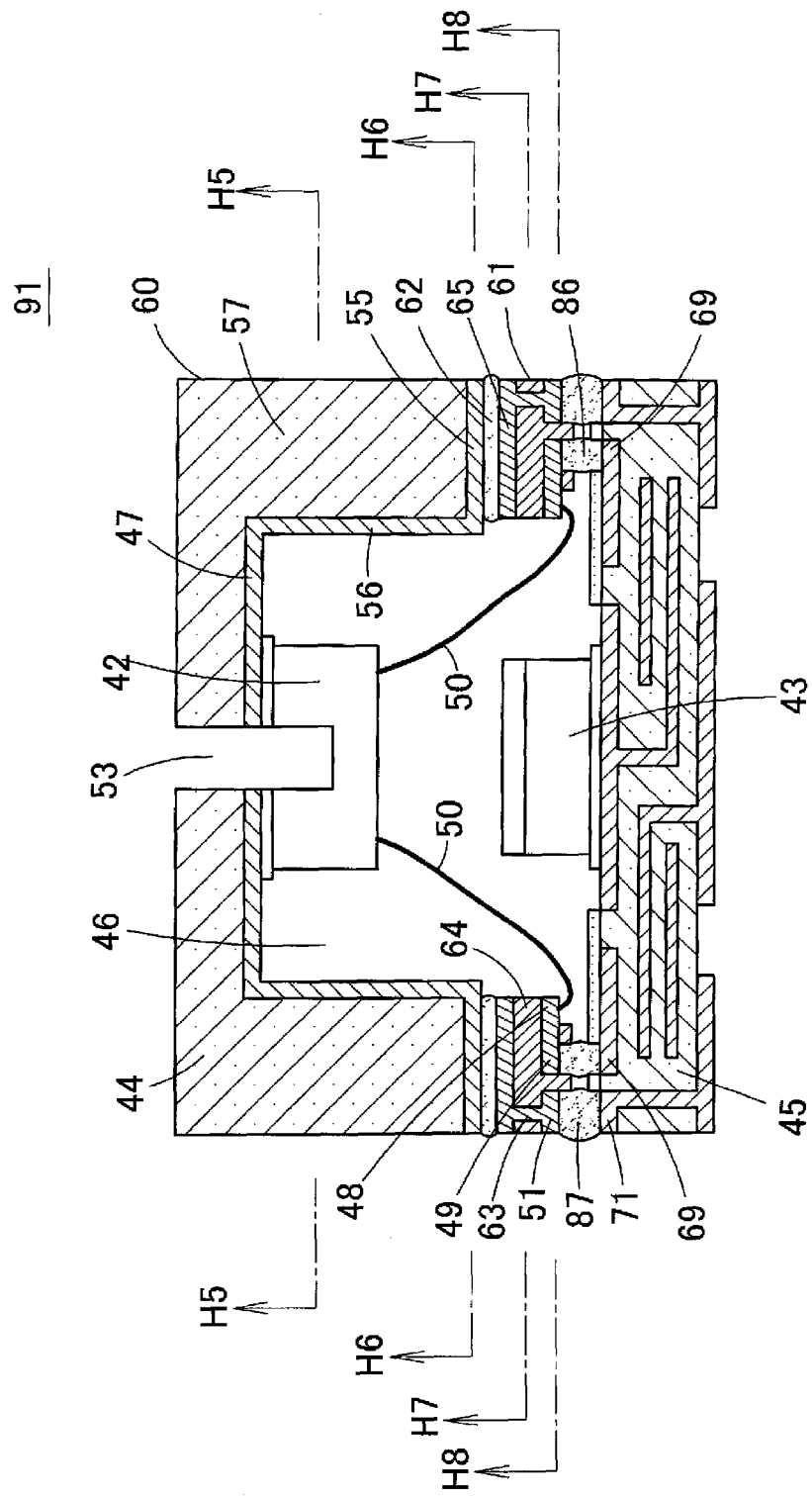
FIG. 11 is a cross-sectional diagram of a microphone according to an embodiment.
Figure 12:
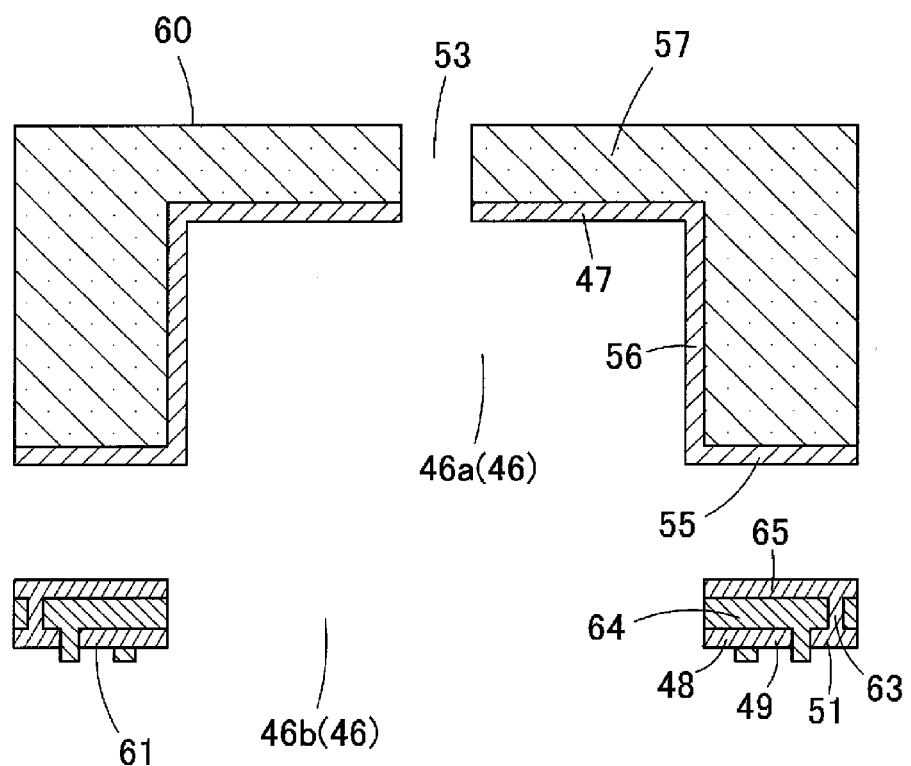
FIG. 12 is a partially exploded cross-sectional diagram of a cover used in the microphone of FIG. 11.

FIG. 11 is a cross-sectional diagram of a top-bottom microphone 91. FIG. 12 is a cross-sectional diagram of a cover 44 of the microphone 91. FIGS. 13(A) to 13(D) are a cross-sectional diagram of the cover along line H5-H5 in FIG. 11, a cross-sectional diagram of the cover along line H6-H6 in FIG. 11, a cross-sectional diagram of the cover along line H7-H7 in FIG. 11, and a cross-sectional diagram of the cover along line H8-H8 in FIG. 11.

Figure 13:
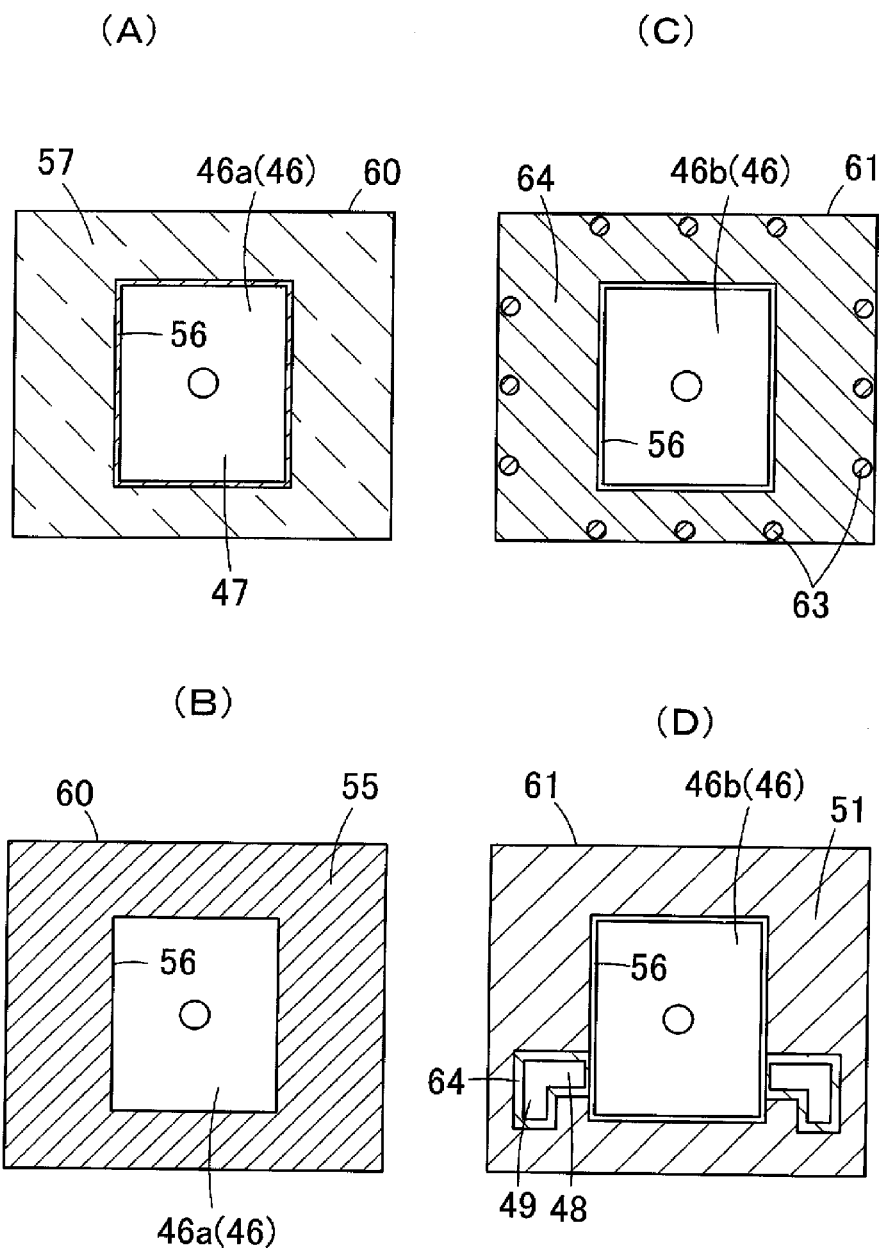
FIG. 13(A) is a cross-sectional diagram of the cover along line H5-H5 in FIG. 11.
FIG. 13(B) is a cross-sectional diagram of the cover along line H6-H6 in FIG. 11.
FIG. 13(C) is a cross-sectional diagram of the cover along line H7-H7 in FIG. 11.
FIG. 13(D) is a cross-sectional diagram of the cover along line H8-H8 in FIG. 11.

According to the microphone 91, the cover 44 is formed from a cover main body 60 (a main member) and an auxiliary plate 61 (an auxiliary member), and the auxiliary plate 61 is integrally joined to the lower surface of the cover main body 60 by a conductive joining material 62. As shown in FIG. 12, the cover main body 60 is formed by an insulating material 57 of plastic, ceramic or the like, and includes a concave part 46a on the lower surface, and an acoustic perforation 53 is provided on the top surface of the concave part 46a. Also, as shown in FIGS. 12, 13(A) and 13(B), a conductive layer 47 is formed to the top surface of the concave part 46a, a conductive layer 56 is formed along the whole perimeter of the inner wall surface of the concave part 46a, and a conductive layer 55 is formed on the entire lower surface of the cover main body 60 on the outside the concave part 46a. The conductive layers 47, 56 and 55 are mutually in conduction, and are connected to the ground via a substrate 45.

On the other hand, the auxiliary plate 61 is formed by a printed wiring board or the like into a frame shape having approximately the same dimensions as the lower surface of the cover main body 60, and includes an opening 46b corresponding to the concave part 46a. As shown in FIGS. 12, 13(C) and 13(D), the auxiliary plate 61 has a joining surface 65 of a metal material formed on the entire upper surface of a plate-shaped insulating material 64, and has a bonding pad 48 and a cover-side joining portion 49 that are in conduction with each other and a ground joining portion 51 formed on the lower surface, and the joining surface 65 and the ground joining portion 51 are electrically connected through a via hole 63.

As shown in FIG. 11, the cover main body 60 and the auxiliary plate 61 are integrated by joining the conductive layer 55 formed on the lower surface of the cover main body 60 and the joining surface 65 provided on the upper surface of the auxiliary plate 61 by the conductive joining material 62.

As the conductive joining material 62, any one of a conductive adhesive, solder, a two-sided conductive adhesive tape, and a brazing filler metal for welding may be used, or a plurality of materials among the above may be used in combination. The cover 44 is formed by joining the cover main body 60 and the auxiliary plate 61 in this manner, and a concave portion 46 of the cover 44 is formed by the concave part 46a of the cover main body 60 and the opening 46b of the auxiliary plate 61.

According to such a structure, even if the cover 44 (the cover main body 60) is a plastic or ceramic molding, for example, the conductive layer 55 may be provided inside the cover 44 in such a way as to cover the vicinity of the bonding pad 48 and the cover-side joining portion 49, and fabrication is facilitated.

Figure 14:
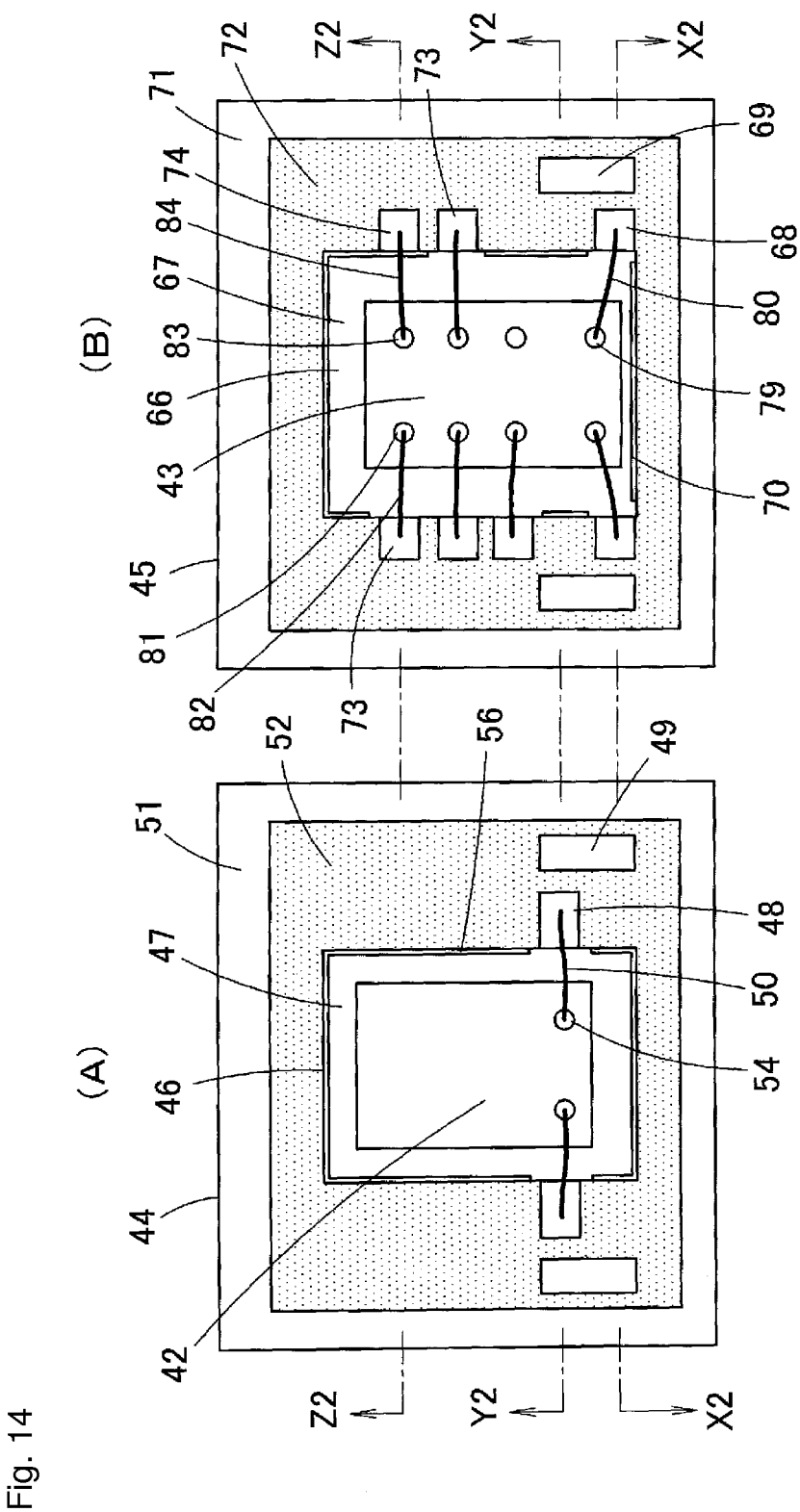
FIG. 14(A) is a bottom view of a cover on which a microphone chip is mounted.
FIG. 14(B) is a plan view of a substrate on which a circuit element is mounted.
Figure 15:
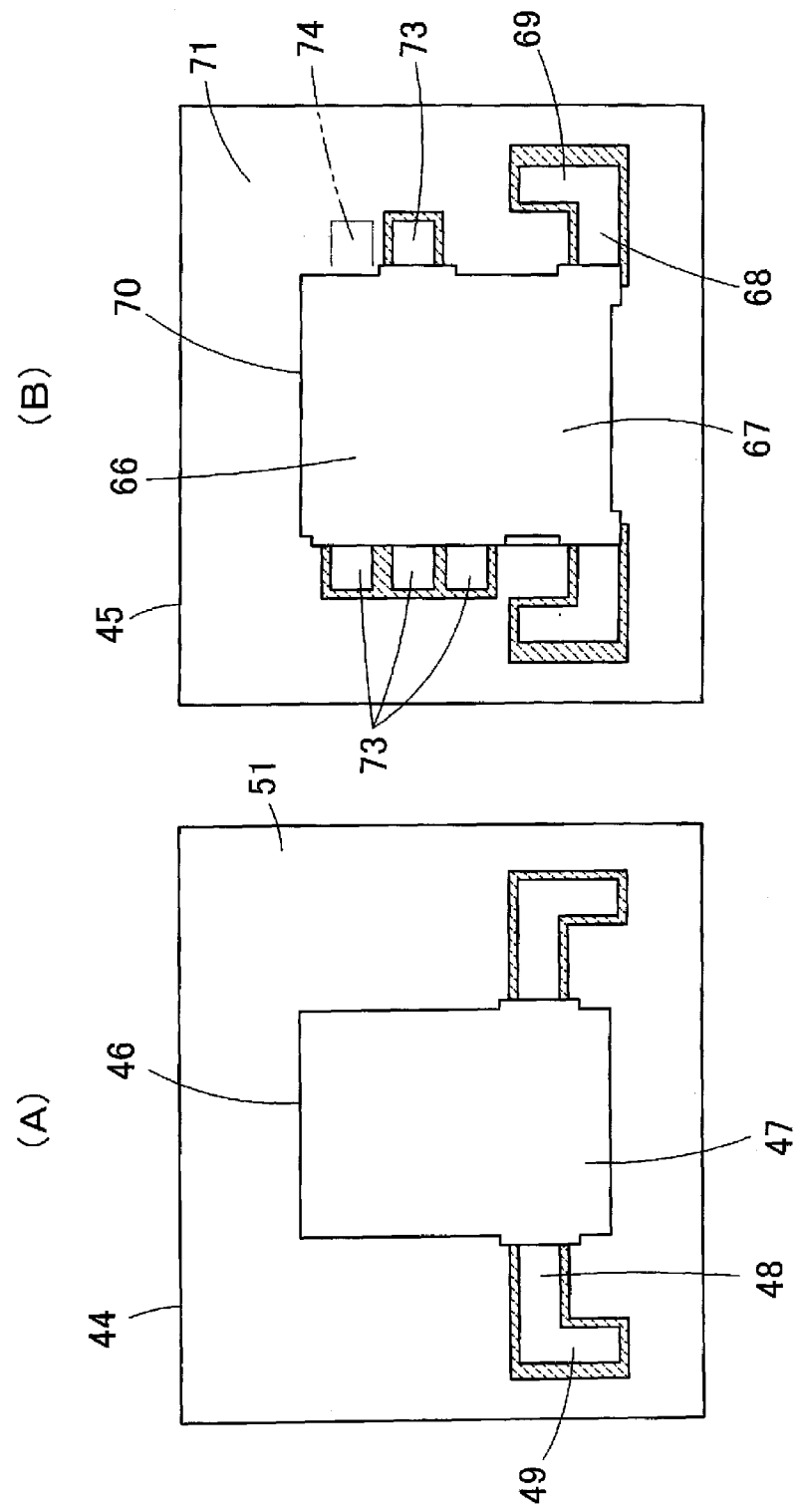
FIG. 15(A) is a bottom view of the cover of FIG. 14(A) from which a solder resist has been removed.
FIG. 15(B) is a plan view of the substrate from which a solder resist has been removed.
Figure 16:
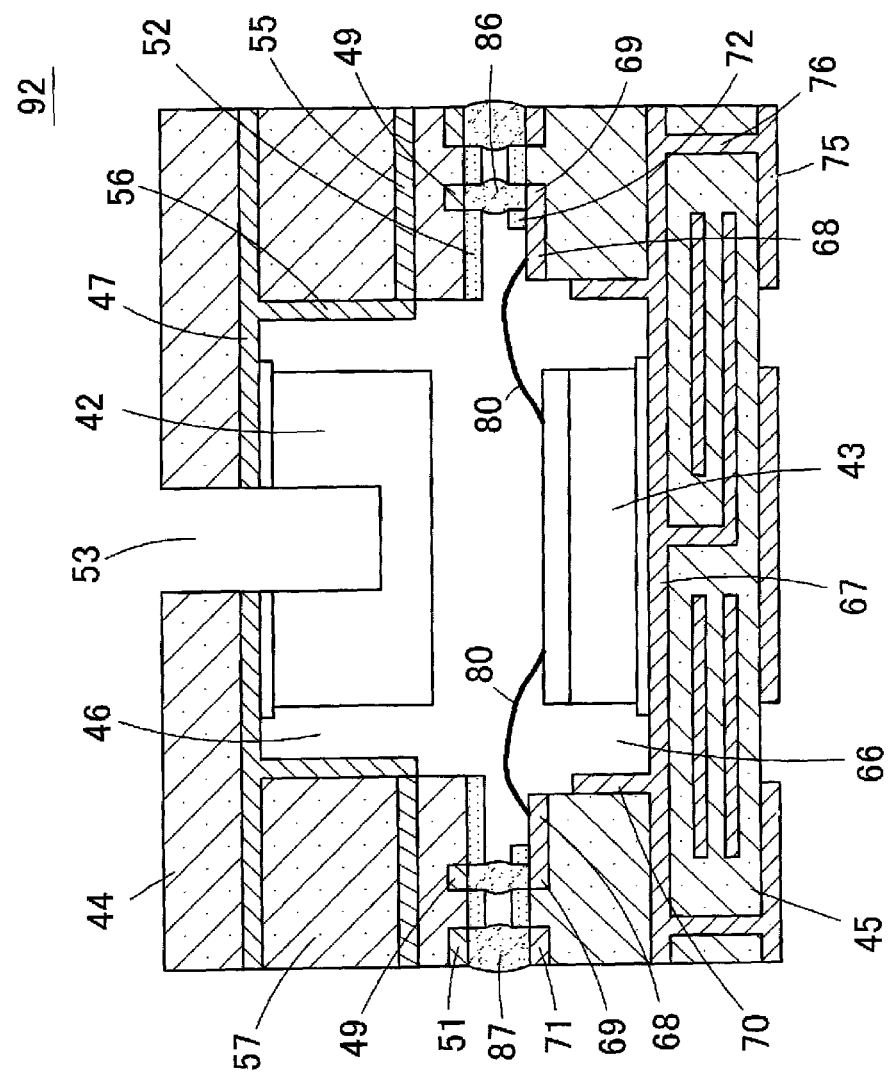
FIG. 16 is a cross-sectional diagram of a microphone in an embodiment, and shows a cross section at a portion corresponding to line X2-X2 in FIGS. 14(A) and 14(B)
Figure 17:
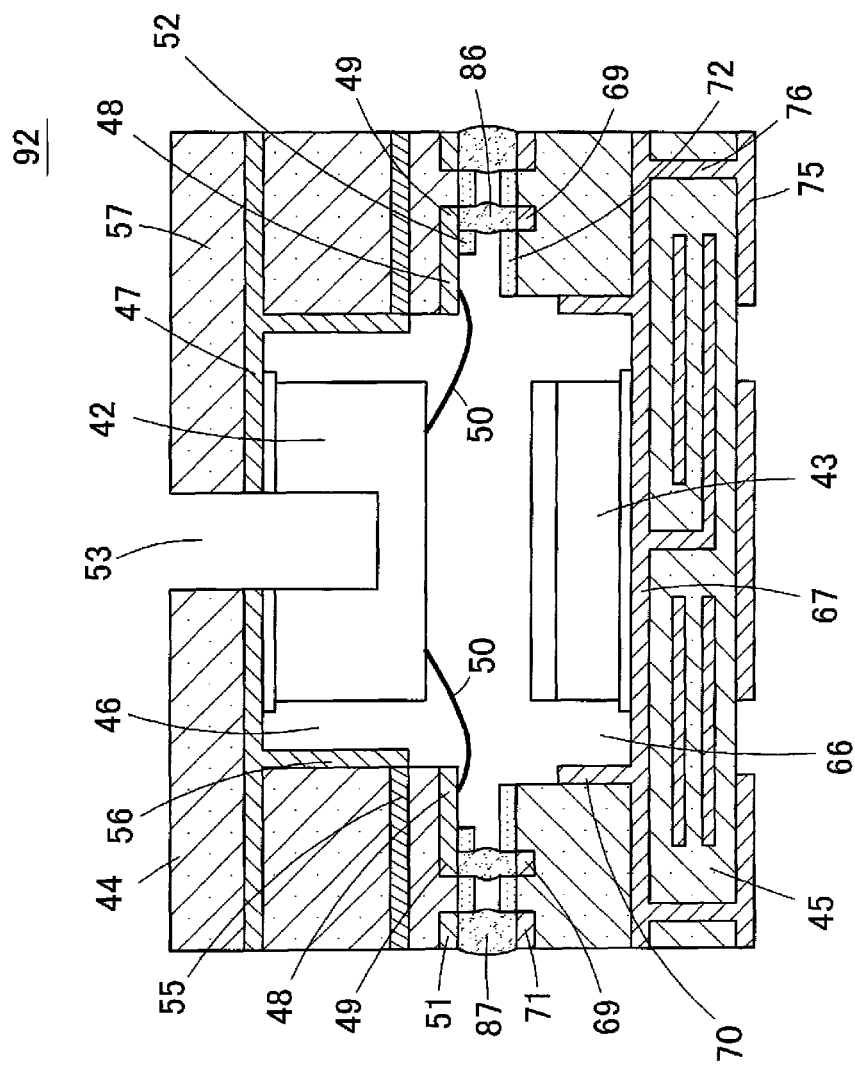
FIG. 17 is a cross-sectional diagram of the microphone of FIG. 16, and shows a cross section at a portion corresponding to line Y2-Y2 in FIGS. 14(A) and 14(B)
Figure 18:
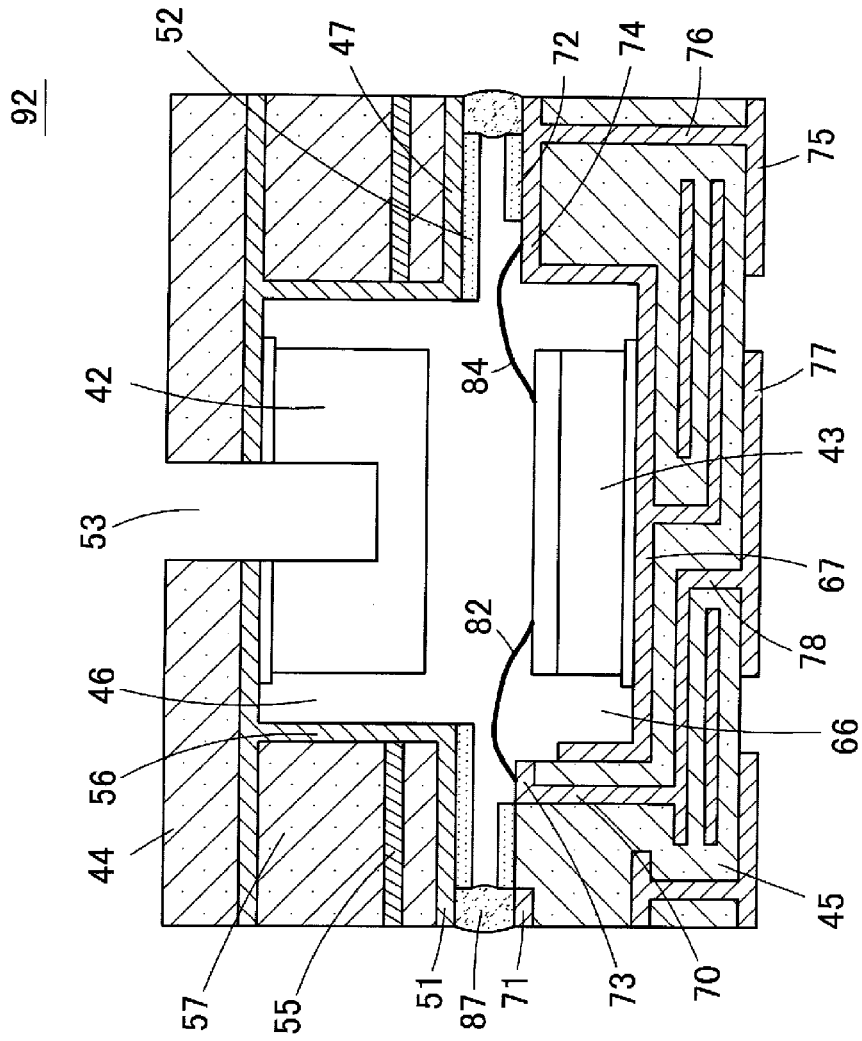
FIG. 18 is a cross-sectional diagram of the microphone of FIG. 16, and shows a cross section at a portion corresponding to line Z2-Z2 in FIGS. 14(A) and 14(B)

Next, a top-port microphone 92 according to a third an embodiment of the invention will be described. FIG. 14(A) is a bottom view of a cover 44 on which a microphone chip 42 is mounted, and FIG. 14(B) is a plan view of a substrate 45 on which a circuit element 43 is mounted. FIG. 15(A) is a bottom view of the cover 44 from which a solder resist has been removed, and FIG. 15(B) is a plan view of the substrate 45 from which a solder resist has been removed. Also, FIG. 16 is a cross-sectional diagram of the microphone 92 at a portion corresponding to line X2-X2 in FIGS. 14(A) and 14(B). FIG. 17 is a cross-sectional diagram of the microphone 92 at a portion corresponding to line Y2-Y2 in FIGS. 14(A) and 14(B). FIG. 18 is a cross-sectional diagram of the microphone 92 at a portion corresponding to line Z2-Z2 in FIGS. 14(A) and 14(B).

The microphone 92 uses a substrate 45 comprising a concave portion 66. The cover 44 on which the microphone chip 42 is mounted has the same structure as in the cover as shown in the embodiment referred to in FIGS. 4(A) and 4(B) to FIGS. 10(A) to 10(C), and a conductive layer 55 for electromagnetic shielding is provided near a bonding pad 48 and a cover-side joining portion 49 in such a way as to cover above the bonding pad 48 and the cover-side joining portion 49. As shown in FIG. 15(B), a conductive layer 67 is provided on the bottom surface of the concave portion 66, and a conductive layer 70 is provided along the whole perimeter of the inner wall surface of the concave portion 66. Also, a metal film is provided on the upper surface of the cover 44 (the upper surface of regions outside the concave portion 66), and a bonding pad 68, a substrate-side joining portion 69, a bonding pad 73, and a ground joining portion 71 are formed by partially removing the metal film. The conductive layers 67 and 70 and the ground joining portion 71 are linked, and configure an electromagnetic shield portion. Moreover, as shown in FIG. 14(B), by covering the upper surface of the substrate 45 in a frame-like manner by a solder resist 72, the ground joining portion 71 is exposed at the outer peripheral portion, and a region for mounting the circuit element 43 is formed inside the concave portion 66. Also, the bonding pad 68, the substrate-side joining portion 69, and the bonding pads 73 and 74 are formed by being exposed from the solder resist 72.

As shown in FIGS. 16, 17 and 18, according to the microphone 92 where the cover 44 and the substrate 45 are stacked with each other, the ground joining portion 51 and the ground joining portion 71 are joined on the upper surface of the substrate 45 by a conductive material 87. Also, the cover-side joining portion 49 and the substrate-side joining portion 69 are joined on the upper surface of the substrate 45 by a conductive material 86, and the microphone chip 42 and the circuit element 43 are connected via bonding wires 50 and 80.

Also according to such a microphone 92, the conductive layer 55 provided to the cover 44 covers above the bonding pad 48, the cover-side joining portion 49, end portions of the bonding wires 50 and 80, and the like, and the noise immunity of the microphone 92 is improved.

In the case the substrate 45 includes the concave portion 66, as with the microphone 92, if noise comes from lower oblique side of the outer peripheral portion of the substrate 45, the bonding pad 68, the cover-side joining portion 69, or the high-impedance bonding wire 80 may possibly pick up the noise.

Figure 19:
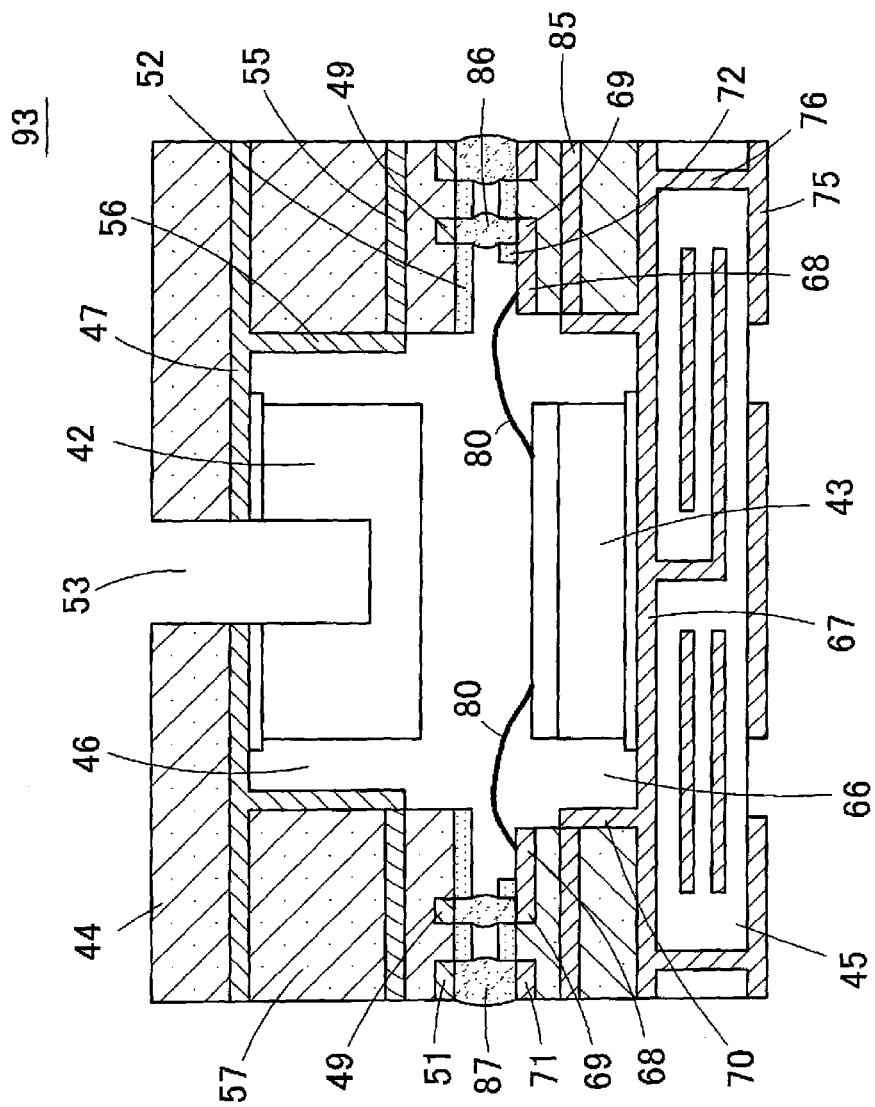
FIG. 19 is a cross-sectional diagram of a microphone according to an embodiment.

In this case, as with a microphone 93 shown in FIG. 19, a conductive layer 85 for electromagnetic shielding may be horizontally provided on the lower side of the bonding pad 68, the substrate-side joining portion 69, an end portion of the bonding wire 80 and the like to electromagnetically shield the bonding pad 68, the substrate-side joining portion 69, the bonding wire 80 and the like. The conductive layers 67, 70 and 85 are in conduction with one another, and are connected to the ground via the substrate 45, and an electromagnetic shield portion is thus configured.

Furthermore, although not shown, depending on the case, the conductive layer 55 of the cover 44 may be omitted, and the conductive layer 85 for electromagnetic shielding may be provided only to the substrate 45.

Figure 20:
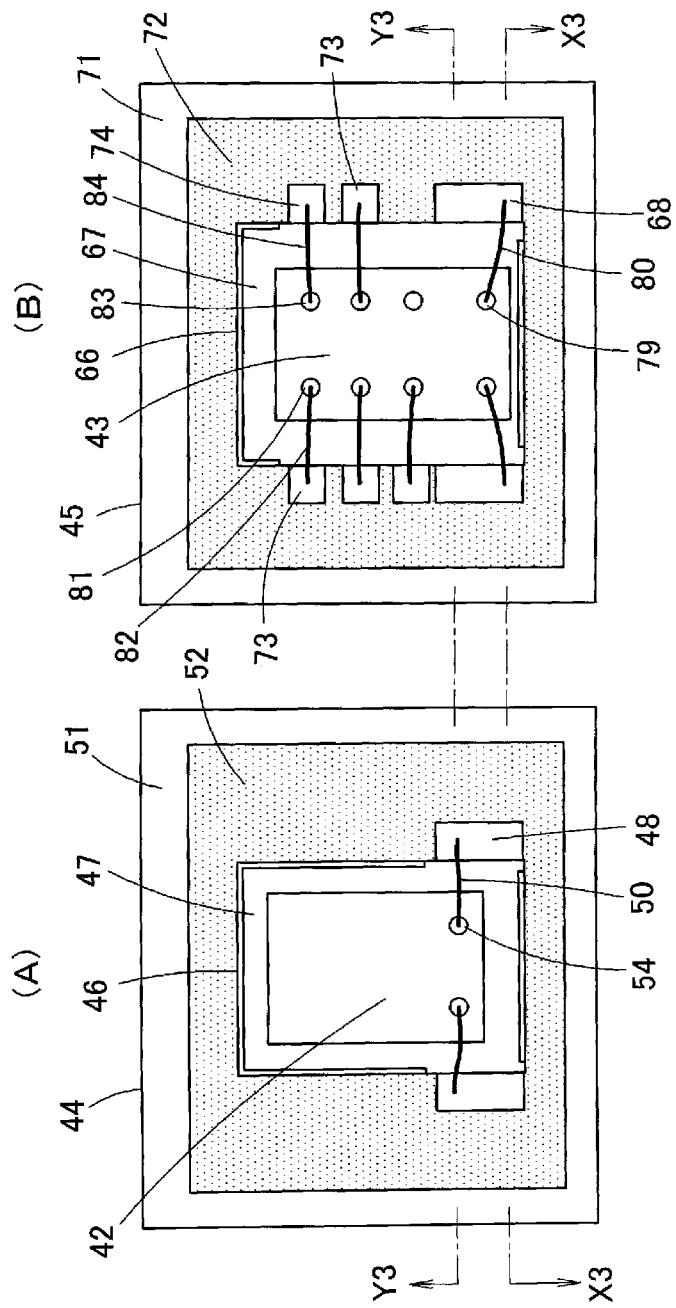
FIG. 20(A) is a bottom view of a cover on which a microphone chip is mounted.
FIG. 20(B) is a plan view of a substrate on which a circuit element is mounted.
Figure 21:
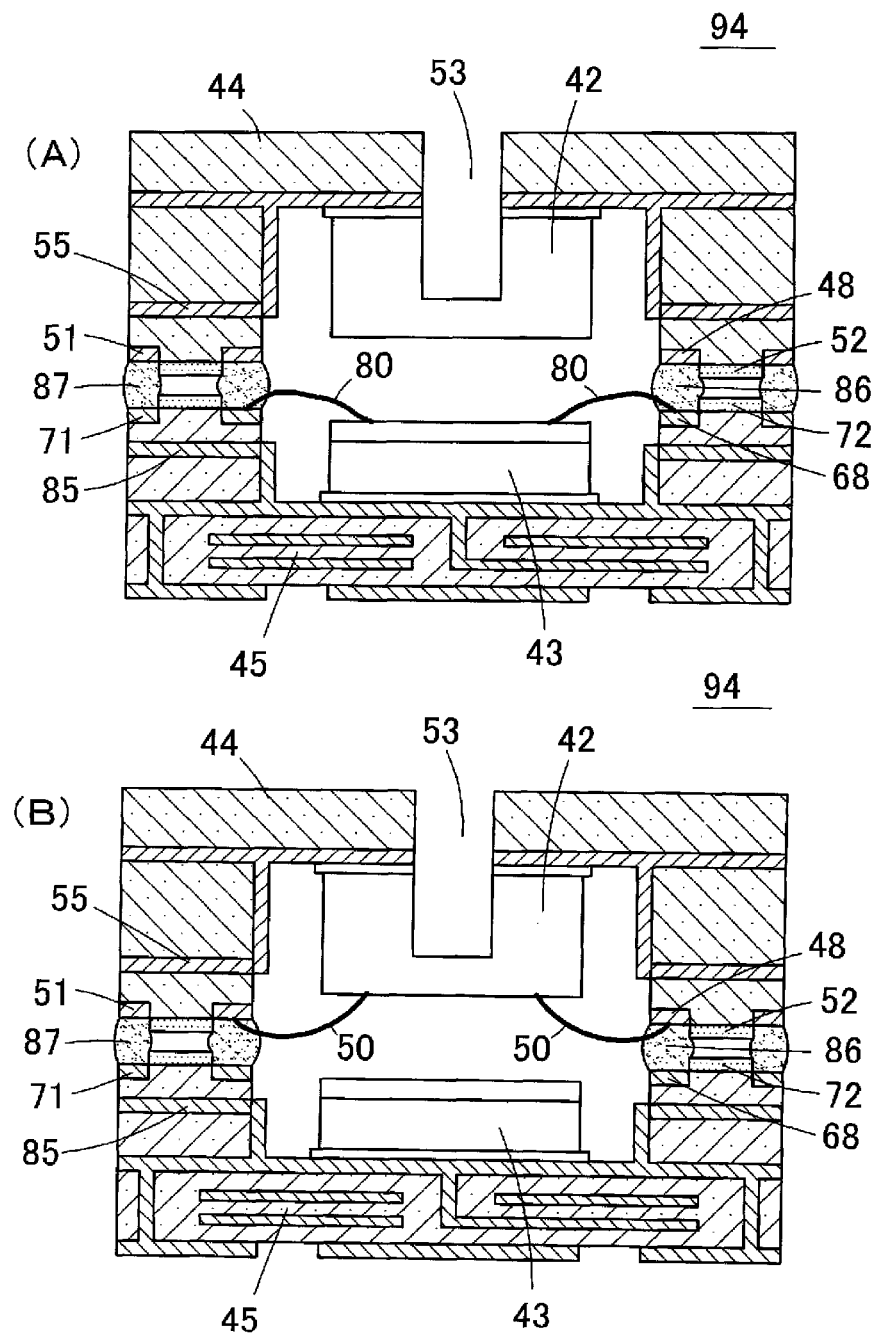
FIG. 21(A) is a cross-sectional diagram of a microphone according to an embodiment, and shows a cross section at a portion corresponding to line X3-X3 in FIGS. 20(A) and 20(B)
FIG. 21(B) is a cross-sectional diagram of the microphone of FIG. 19, and shows a cross section at a portion corresponding to line Y3-Y3 in FIGS. 20(A) and 20(B)

Next, a microphone 94 will be described. FIG. 20(A) is a bottom view of a cover 44 on which a microphone chip 42 is mounted, and FIG. 20(B) is a plan view of a substrate 45 on which a circuit element 43 is mounted. FIG. 21(A) is a cross-sectional diagram of the microphone 94 at a portion corresponding to line X3-X3 in FIGS. 20(A) and 20(B). FIG. 21(B) is a cross-sectional diagram of the microphone 94 at a portion corresponding to line Y3-Y3 in FIGS. 20(A) and 20(B).

According to the microphone 94, one end of a bonding wire 50 is connected to a terminal 54 of the microphone chip 42 mounted on the cover 44, and the other end of the bonding wire 50 is connected to a bonding pad 48 of the cover 44. Also, one end of a bonding wire 80 is connected to a terminal 79 of the circuit element 43 mounted on the substrate 45, and the other end of the bonding wire 80 is connected to a bonding pad 68 of the substrate 45. Moreover, as shown in FIGS. 21(A) and 21(B), the bonding pad 48 of the cover 44 and the bonding pad 68 of the substrate 45 are directly joined by a conductive material 86, and the microphone chip 42 and the circuit element 43 are thereby connected. Accordingly, a cover-side joining portion 49 and a substrate-side joining portion 69 are not provided.

Figure 22:
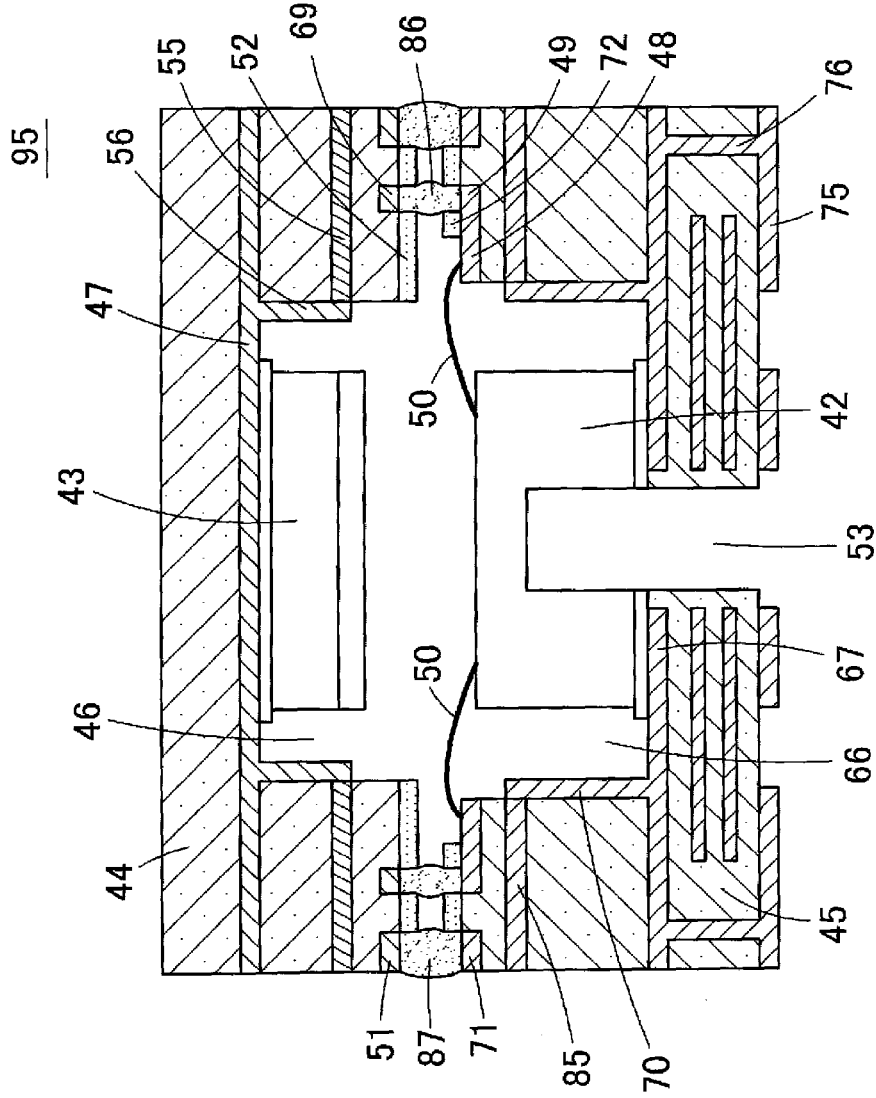
FIG. 22 is a cross-sectional diagram of a microphone according to an embodiment.

A microphone 95 is shown in FIG. 22. According to this microphone 95, a circuit element 43 is mounted on the lower surface of a cover 44, and a microphone chip 42 is mounted on the upper surface of a substrate 45. Although, in FIG. 22, a bottom-port type is achieved by providing an acoustic perforation 53 to the substrate 45, it is also possible to achieve a top-port type by providing an acoustic perforation to the cover 44. Also with such a microphone 95, the noise immunity of the microphone 95 may be improved by horizontally providing a conductive layer 55 for electromagnetic shielding inside the cover 44, or by horizontally providing a conductive layer 85 for electromagnetic shielding inside the substrate 45.

Figure 23:
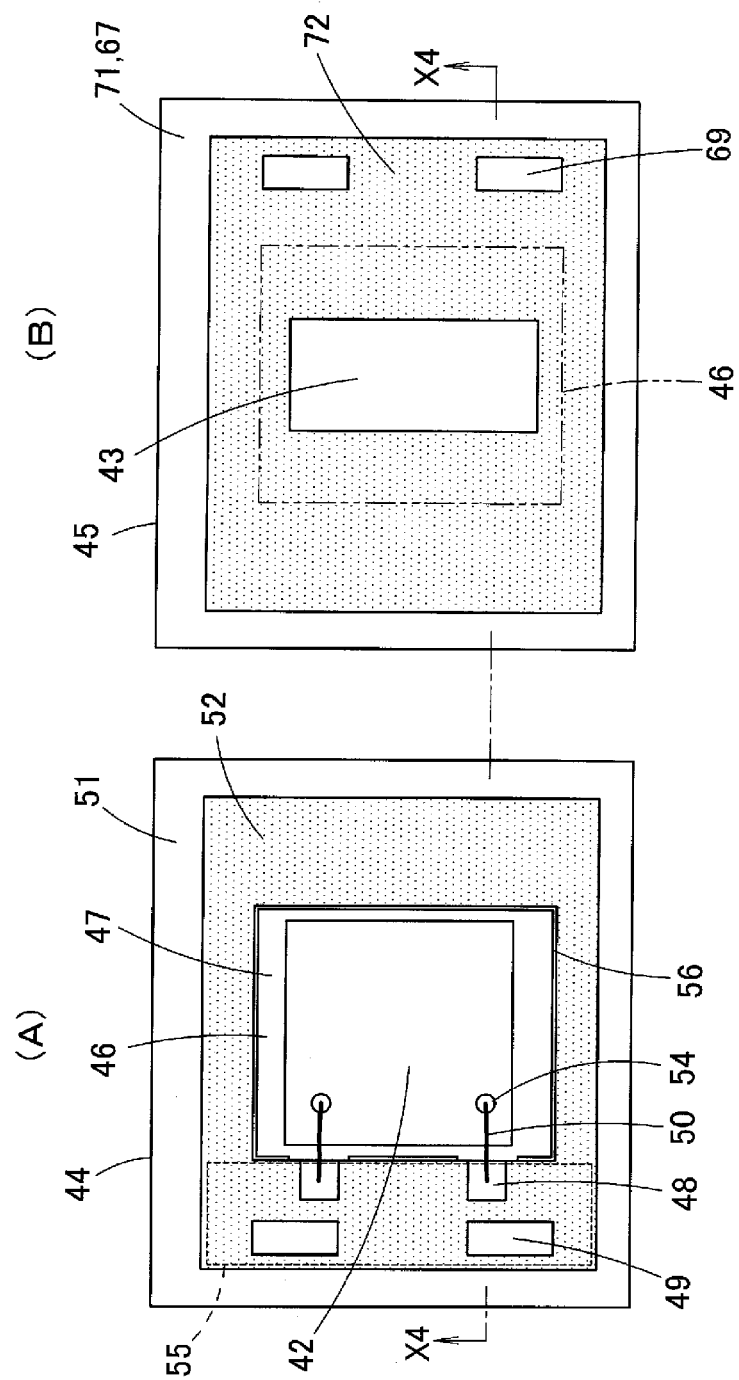
FIG. 23(A) is a bottom view of a cover on which a microphone chip is mounted.
FIG. 23(B) is a plan view of a substrate on which a circuit element is mounted.
Figure 24:
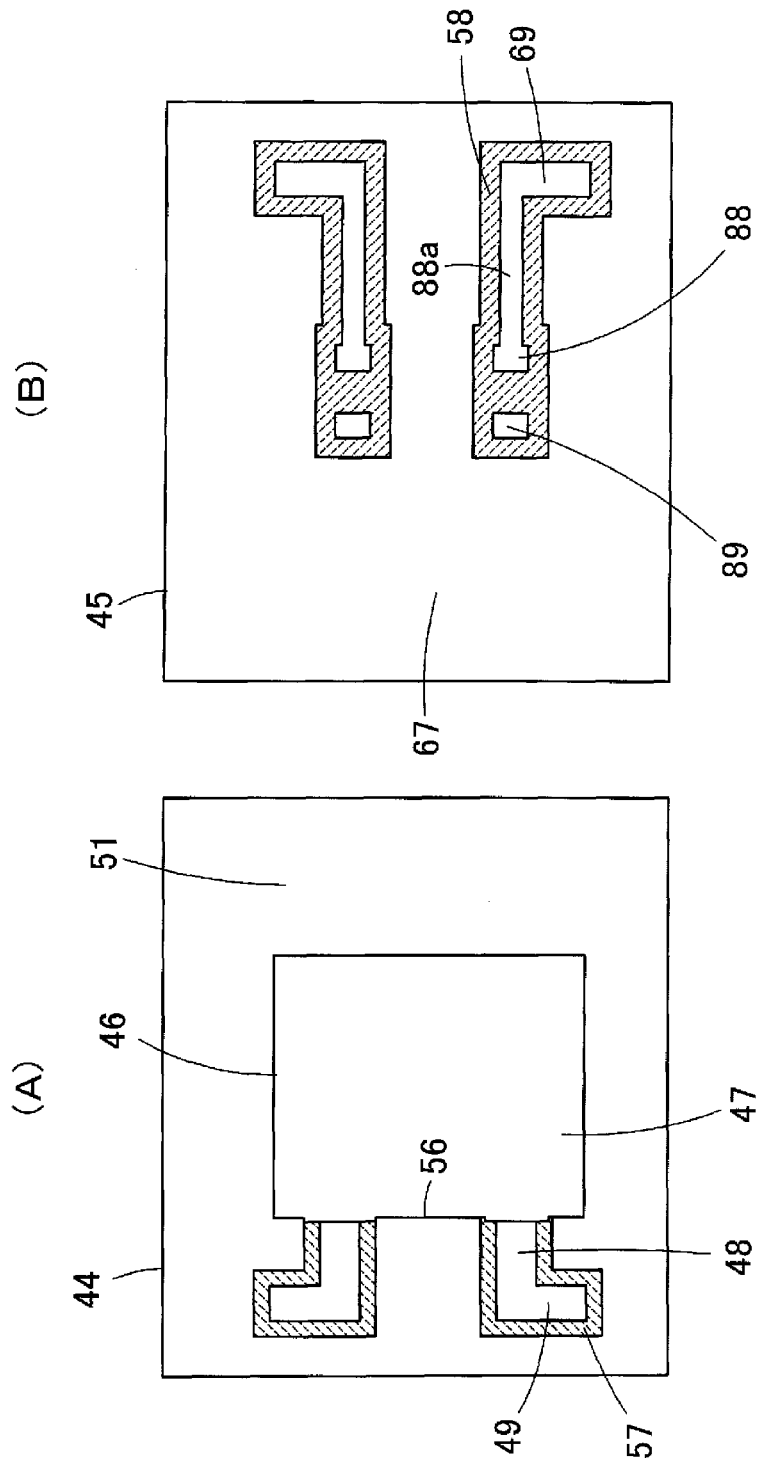
FIG. 24(A) is a bottom view of the cover from which a solder resist has been removed.
FIG. 24(B) is a plan view of the substrate from which a solder resist has been removed.
Figure 25:
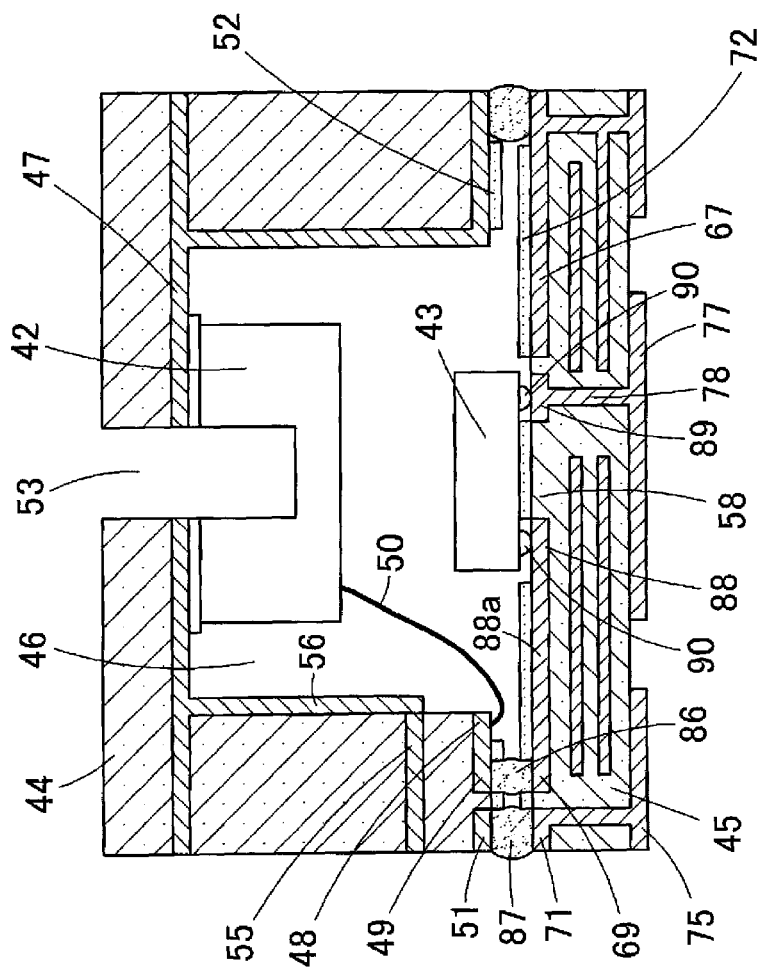
FIG. 25 is a cross-sectional diagram of an microphone in an embodiment, and shows a cross section at a portion corresponding to line X4-X4 in FIGS. 23(A) and 23(B)

A microphone 96 will be described with reference to FIGS. 23(A) and 23(B), FIGS. 24(A) and 24(B), and FIG. 25. FIG. 23(A) is a bottom view of a cover 44 on which a microphone chip 42 is mounted, and FIG. 23(B) is a plan view of a substrate 45 on which a circuit element 43 is mounted. FIG. 24(A) is a bottom view of the cover 44 from which a solder resist has been removed, and FIG. 24(B) is a plan view of the substrate 45 from which a solder resist has been removed. FIG. 25 is a cross-sectional diagram of the microphone 96 at a portion corresponding to line X4-X4 in FIGS. 23(A) and 23(B).

According to the microphone 96, the circuit element 43 is bump-joined to the substrate 45. That is, as shown in FIG. 24(B), a plurality of bump-joining pads 88 (bump pads) and bump-joining pads 89 are provided on the upper surface of the substrate 45 while being insulated from a conductive layer 67. The bump-joining pad 88 is connected to a substrate-side joining portion 69 by a pattern wiring 88a. Also, as shown in FIG. 25, the bump-joining pad 89 is connected to a signal input/output terminal 77 on the underside through a via hole 78. The upper surface of the substrate 45 is covered by a solder resist 72 except for the outer peripheral portion (a ground joining portion 71) of the conductive layer 67, but the bump-joining pads 88 and 89, and the substrate-side joining portion 69 are exposed from the solder resist 72.

As shown in FIG. 25, a plurality of bumps 90 are provided on the lower surface of the circuit element 43, and the bump-joining pad 88 or 89 is bump-joined to each bump 90. Therefore, each bump is linked to the substrate-side joining portion 69 on the upper surface of the substrate or the signal input/output terminal 77 on the lower surface of the substrate. The bump 90 of the circuit element 43 is a solder bump, an Au bump, a conductive bump of other conductive material, a bump formed of an anisotropic conductive material (ACF, ACP) or the like.

The structure of the cover 44 mounted on the microphone chip 42 is approximately the same as the cover as shown in the embodiment referred to in FIGS. 4(A) and 4(B) to FIGS. 10(A) to 10(C), and a terminal 54 of the microphone chip 42 and a bonding pad 48 are connected by a bonding wire 50. However, in the top-port microphone 41, the bonding wires 50 connecting the microphone chip 42 mounted on the cover 44 and the bonding pads 48 are arranged each on the left and right sides. On the other hand, in the case of the microphone 96, a pair of bonding wires 50 are arranged on the same side, as shown in FIG. 23(A). Accordingly, the bonding pads 48 and cover-side joining portions 49 are provided, on the cover 44, on the same side with respect to the region where the microphone chip 42 is mounted, and the substrate-side joining portions 69 are arranged, on the substrate 45, on the same side with respect to a circuit element mounting region.

Then, with this microphone 96, the cover 44 is stacked on the substrate 45, the ground joining portion 71 and a ground joining portion 51 are joined by a conductive material 87, and the substrate 45 and the cover 44 are sealed and integrated. At the same time, the substrate-side joining portion 69 and the cover-side joining portion 49 are joined by a conductive material 86, and the circuit element 43 and the microphone chip 42 are connected. Additionally, in FIG. 23(B), the position of the inner peripheral wall surface of the cover 44 is shown by a two-dot chain line.

According to this structure, the microphone chip 42 and the circuit element 43 are connected by the bonding wires 50 and the bumps 90, short-circuiting due to the bonding wires 50 and 80 coming into contact is less likely to occur compared to a case where the microphone chip 42 and the circuit element 43 are connected by the bonding wires 50 and 80.

In the case of the structure, since the bonding wires 50 are gathered on one side of the microphone chip mounting region, it is sufficient if a conductive layer 55 provided inside the cover 44 is provided only on the side where the bonding pads 48 and the cover-side joining portions 49 are provided, as shown in FIG. 23(A). Alternatively, the conductive layer 55 may also be provided on the entire periphery of a concave portion 46.

Figure 26:
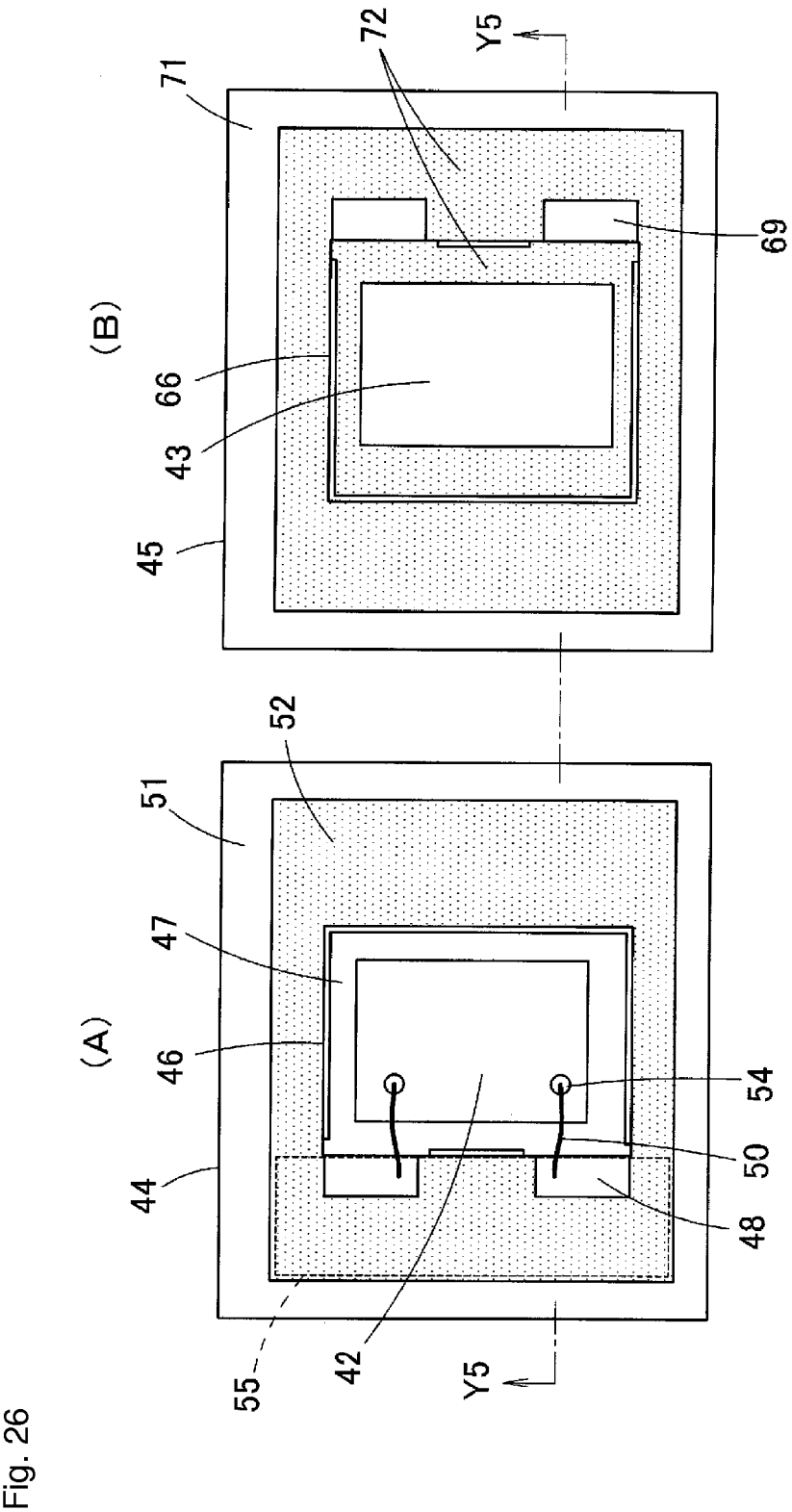
FIG. 26(A) is a bottom view of a cover on which a microphone chip is mounted.
FIG. 26(B) is a plan view of a substrate on which a circuit element is mounted.
Figure 27:
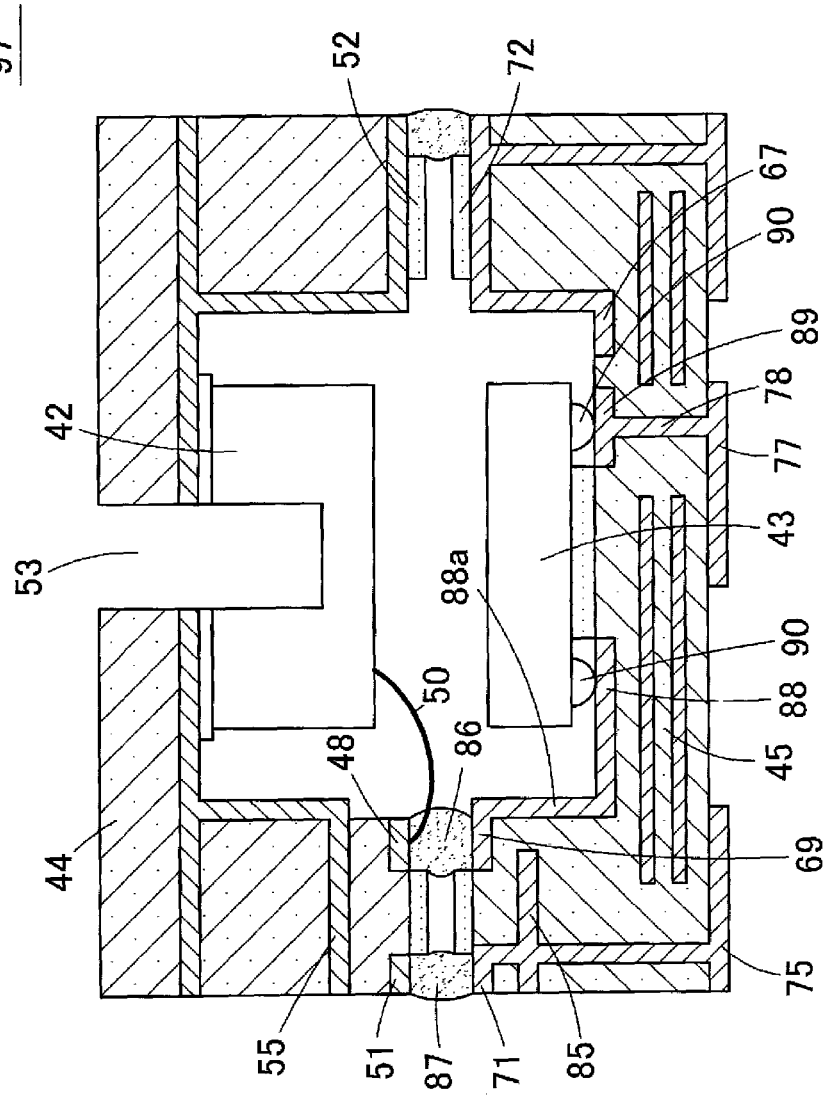
FIG. 27 is a cross-sectional diagram of a microphone in an embodiment, and shows a cross section at a portion corresponding to line X5-X5 in FIGS. 26(A) and 26(B).

A microphone 97 will be described with reference to FIGS. 26(A) and 26(B), and FIG. 27. FIG. 26(A) is a bottom view of a cover 44 on which a microphone chip 42 is mounted. FIG. 26(B) is a plan view of a substrate 45 on which a circuit element 43 is mounted. FIG. 27 is a cross-sectional diagram of the microphone 97, and shows a cross section at a portion corresponding to line X5-X5 in FIGS. 26(A) and 26(B).

In the microphone 97, and the microphone 96 as shown in FIG. 23(A), FIG. 23(B), FIG. 24, and FIG. 25, the circuit element 43 is bump-joined to bump-joining pads 88 and 89 of the substrate 45. On the other hand, on the cover 44, a bonding pad 48 to which a bonding wire 50 is connected is directly joined to a substrate-side joining portion 69 of the substrate 45 by a conductive material 86.

Also in this case, since the bonding wires 50 are gathered on one side of the microphone chip mounting region, it is sufficient if a conductive layer 55 provided inside the cover 44 is only on the side where the bonding pads 48 and cover-side joining portions 49 are provided, as shown in FIG. 26(A). Alternatively, the conductive layer 55 may also be provided on the entire periphery of a concave portion 46.

(Others) In addition to the embodiments described above, the invention may be applied to various embodiments described in Japanese Patent Application No. 2010-125527. For example, according to the top-port microphone described above, the acoustic perforation 53 is provided on the cover 44 at the position of the microphone chip 42, but the acoustic perforation 53 may be provided to the cover 44 at a position away from the microphone chip 42 (for example, the microphone shown in FIGS. 9 to 11 of Japanese Patent Application No. 2010-125527). Furthermore, a top-port microphone is also allowed where the microphone chip 42 is mounted on the substrate 45, and the acoustic perforation 53 is provided on the cover 44.

Figure 1:
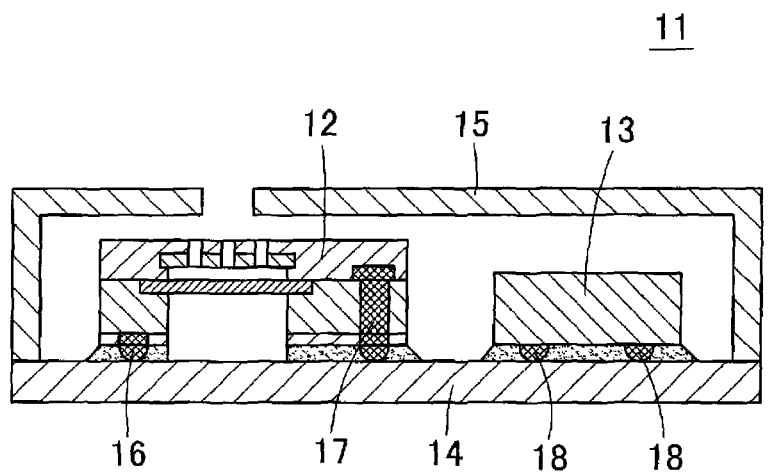
FIG. 1 is a cross-sectional diagram showing a structure of a conventional microphone.
Figure 2:
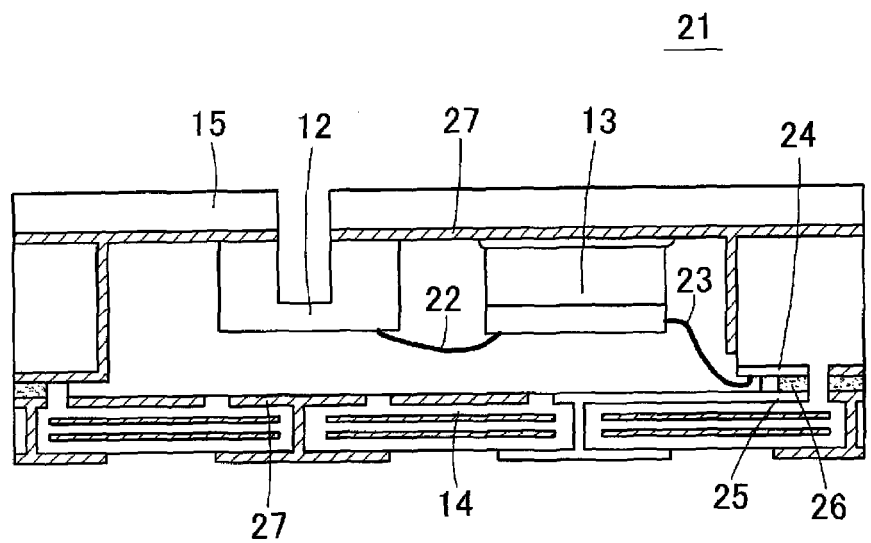
FIG. 2 is a cross-sectional diagram of a microphone disclosed in a patent application filed by the applicant.
Figure 3:
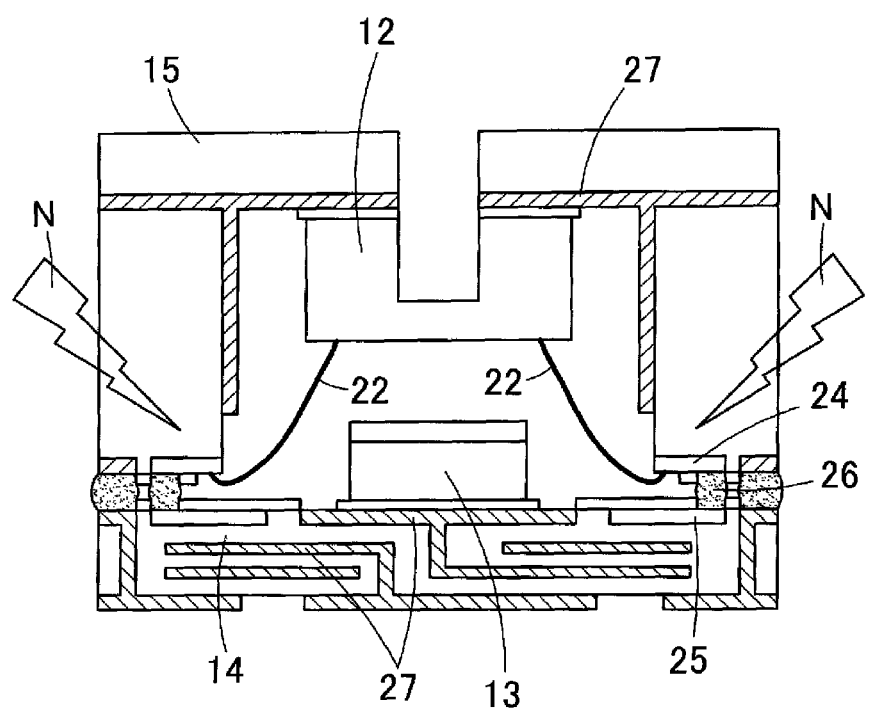
FIG. 3 is a cross-sectional diagram of a microphone disclosed in another patent application filed by the applicant.

Also, according to the bottom-port microphone described above, the acoustic perforation 53 is provided on the substrate 45 at the position of the microphone chip 42, but the acoustic perforation 53 may be provided to the substrate 45 at a position away from the microphone chip 42 (for example, the microphone shown in FIG. 3 or FIG. 6 of Japanese Patent Application No. 2010-125527). Furthermore, a bottom-port microphone is also allowed where the microphone chip 42 is mounted on the cover 44, and the acoustic perforation 53 is provided on the substrate 45.

Furthermore, the microphone or the circuit element may be bump-connected to an electrode pad of the cover, and the electrode pad of the cover and the bonding pad of the cover may be connected by a pattern wiring provided to the cover. Similarly, the circuit element or the microphone may be bump-connected to an electrode pad of the substrate, and the electrode pad of the substrate and the bonding pad of the substrate may be connected by a pattern wiring provided to the substrate.

Disclosed is a semiconductor device including a package formed from a first member and a second member, the package having a concave portion formed on an inner surface of at least one member of the first member and the second member, a sensor mounted on an inner surface of the first member, a circuit element mounted on an inner surface of the second member, and electrical connection means configured to electrically connect the sensor and the circuit element through a joining portion of the first member and the second member, wherein a conductive layer for electromagnetic shielding is provided near a part, of the joining portion of the first member and the second member through which the electrical connection means is passed. Additionally, the term "joining portion" in the specification and the claims includes not only the region where the first member and the second member are directly joined, but also its peripheral region.

With the semiconductor device of the invention, since a conductive layer for electromagnetic shielding is provided near a part of the joining portion of the first member and the second member through which the electrical connection means is passed, the electrical connection means connecting the sensor and the circuit element is electromagnetically shielded by the conductive layer for electromagnetic shielding, thereby making noise less easily picked up, and the noise immunity of the semiconductor device is improved.

According to an aspect of the semiconductor device of the invention, the conductive layer for electromagnetic shielding is provided to at least one member of the first member and the second member, in parallel with a surface of the joining portion to the other member. According to such an aspect, by using a multilayer wiring board, a copper clad laminate, a glass epoxy substrate, or the like as the conductive layer for electromagnetic shielding, the conductive layer for electromagnetic shielding may be easily provided. Also, the conductive layer for electromagnetic shielding may be collectively provided to a plurality of semiconductor devices, and the production yield is increased.

According to another aspect of the semiconductor device of the invention, the conductive layer for electromagnetic shielding is provided to at least one member of the first member and the second member, on a side farther away from the other member than the joining portion to the other member. According to such an aspect, the electrical connection means is configured to connect the first and second members and may be shielded by the conductive layer for electromagnetic shielding, and the noise immunity of the semiconductor device is increased.

According to another aspect of the semiconductor device of the invention, the conductive layer for electromagnetic shielding is embedded in at least one member of the first member and the second member. According to such an aspect, by using a multilayer wiring board, a copper clad laminate, a glass epoxy substrate, or the like as the conductive layer for electromagnetic shielding, the conductive layer for electromagnetic shielding may be easily provided. Also, the conductive layer for electromagnetic shielding may be collectively provided to a plurality of semiconductor devices, and the production yield is increased.

According to another aspect of the semiconductor device of the invention, the conductive layer for electromagnetic shielding is provided to the at least one member of the first member and the second member comprising the concave portion, in a periphery of the concave portion. According to such an aspect, the periphery of the concave portion may be covered and be electromagnetically shielded by the conductive layer for electromagnetic shielding.

Also, a first conductive layer may be formed on a top surface or on a bottom surface of the concave portion, and a second conductive layer may be formed on an inner peripheral wall surface of the concave portion, and the first conductive layer, the second conductive layer, and the conductive layer for electromagnetic shielding may be in conduction with one another. According to such an aspect, a structure for electromagnetic shielding may be formed on the inner surface of the package, and the production yield for the semiconductor device is increased.

According to a further another aspect of the semiconductor device of the invention, the at least one member of the first member and the second member including the concave portion, is structured by adhering together a main member and an auxiliary member. The main member includes a concave part, and also includes the conductive layer for electromagnetic shielding on a surface for adhering to the auxiliary member. The auxiliary member includes an opening, and is adhered to the main member by being stacked on the conductive layer for electromagnetic shielding, and the concave portion is formed from the concave part and the opening. According to such an aspect, even if the main member does not have a laminated structure such as a printed wiring board, the conductive layer for electromagnetic shielding may be easily formed.

According to further another aspect of the semiconductor device of the invention, a first bonding pad is provided to the first member, at a part facing the second member, and the sensor and the first bonding pad are connected by a first wiring, a second bonding pad is provided to the second member, at a part facing the first member, and the circuit element and the second bonding pad are connected by a second wiring, and when forming the package by joining the first member and the second member, the first bonding pad and the second bonding pad are joined by a conductive material. According to such an embodiment, the sensor and the circuit element may be connected by a simple structure through the first and second wirings, the first and second bonding pads, and the conductive material. Also, since the first and second bonding pads are provided to the first and second members respectively at parts facing the other member, when forming the package by stacking the first member and the second member, the first bonding pad and the second bonding pad may be joined by the conductive material and the sensor and the circuit element may be easily connected without causing short-circuiting. Moreover, since the first and second bonding pads are provided to the first and second members respectively at parts facing the other member, the wiring work of the first wiring and the second wiring may be easily performed.

According to a further another aspect of the semiconductor device of the invention, a first bonding pad is provided to the first member, a sensor-side joining portion that is in conduction with the first bonding pad is provided to the first member at a part facing the second member, and the sensor and the first bonding pad are connected by a first wiring, a second bonding pad is provided to the second member, a circuit element-side joining portion that is in conduction with the second bonding pad is provided to the second member at a part facing the first member, and the circuit element and the second bonding pad are connected by a second wiring, and when forming the package by joining the first member and the second member, the sensor-side joining portion and the circuit element-side joining portion are joined by a conductive material. According to such an embodiment, the sensor and the circuit element may be connected by a simple structure through the first and second wirings, the first and second bonding pads, the sensor-side and circuit element-side joining portions, and the conductive material. Also, since the sensor-side and circuit element-side joining portions are provided on surfaces facing each other, when forming the package by stacking the first member and the second member, the sensor-side joining portion and the circuit element-side joining portion may be joined by the conductive material, and the sensor and the circuit element may be easily connected without causing short-circuiting. Moreover, since the bonding pad for connecting a wiring and the sensor-side joining portion to be joined by the conductive material are separate, the assembly work of the semiconductor device is facilitated.

Moreover, according to this aspect, the first bonding pad and the sensor-side joining portion may be formed of a continuous metal film, and the first bonding pad and the sensor-side joining portion may be separated from each other by partially covering a surface of the metal film by an insulating film. The second bonding pad and the circuit element-side joining portion may be formed of a continuous metal film, and the second bonding pad and the circuit element-side joining portion may be separated from each other by partially covering a surface of the metal film by an insulating film. According to such an aspect, since each bonding pad and each joining portion are separated by an insulating film such as a solder resist, the conductive material for joining the joining portions is less likely to flow to the side of the bonding pad.

According to a further another aspect of the semiconductor device of the invention, a bonding pad is provided to the first member, at a part facing the second member, and the sensor and the bonding pad are connected by a wiring, a bump pad is provided to the second member, a circuit element-side joining portion that is in conduction with the bump pad is provided to the second member, at a part facing the first member, and a bump provided to the circuit element is connected to the bump pad, and when forming the package by joining the first member and the second member, the bonding pad and the circuit element-side joining portion are joined by a conductive material. According to such an aspect, the sensor and the circuit element may be connected by a simple structure through the wiring, the bonding pad, the circuit element-side joining portion, the bump pad, and the conductive material. Also, since the bonding pad and the circuit element-side joining portion are provided on surfaces facing each other, the bonding pad and the circuit element-side joining portion may be joined by the conductive material when forming the package by stacking the first member and the second member, and the sensor and the circuit element may be easily connected without causing short-circuiting. According to this aspect, the sensor is connected using a wiring, and the circuit element is bump-connected. Therefore, short-circuiting due to coming into contact with a wiring does not occur as in a case where the wiring is used in the sensor and the circuit element.

According to a further another aspect of the semiconductor device of the invention, a bonding pad is provided to the first member, a sensor-side joining portion that is in conduction with the bonding pad is provided to the first member, at a part facing the second member, and the sensor and the bonding pad are connected by a wiring, a bump pad is provided to the second member, a circuit element-side joining portion that is in conduction with the bump pad is provided to the second member, at a part facing the first member, and a bump provided to the circuit element is connected to the bump pad, and when forming the package by joining the first member and the second member, the sensor-side joining portion and the circuit element-side joining portion are joined by a conductive material. According to such an aspect, the sensor and the circuit element may be connected by a simple structure through the wiring, the bonding pad, the sensor-side and circuit element-side joining portions, the bump pad, and the conductive material. Also, since the sensor-side and circuit element-side joining portions are provided on surfaces facing each other, the sensor-side joining portion and the circuit element-side joining portion may be joined by the conductive material when forming the package by stacking the first member and the second member, and the sensor and the circuit element may be easily connected. According to this aspect, the sensor is connected using a wiring, and the circuit element is bump-connected. Therefore, short-circuiting due to coming into contact with a wiring does not occur as in a case where the wiring is used in the sensor and the circuit element. Moreover, since the bonding pad for connecting a wiring and the sensor-side joining portion to be joined by the conductive material are separate, the assembly work of the semiconductor device is facilitated.

With a microphone of the invention, a microphone chip is used as the sensor of the semiconductor device of invention, and an acoustic perforation is provided on one member of the first member and the second member. According to such a microphone, the noise immunity is increased, and the S/N ratio is improved.

Additionally, the means for solving the problems of the invention may have characteristics obtained by appropriately combining the structural elements described above, and numerous variations of the invention may be made possible by combining the structural elements.

What is claimed is:

1. A semiconductor device comprising:
    a package formed from a first member and a second member, wherein a concave portion is formed on an inner surface of at least one member of the first member and the second member;
    a sensor mounted on an inner surface of the first member;
    a circuit element mounted on an inner surface of the second member; and
    electrical connection means configured to electrically connect the sensor and the circuit element through a joining portion of the first member and the second member,
    wherein the at least one member of the first member and the second member comprising the concave portion, is configured by adhering together a main member and an auxiliary member,
    the main member includes a concave part, and a conductive layer for electromagnetic shielding on a surface for adhering to the auxiliary member,
    the auxiliary member includes an opening, and is adhered to the main member by being stacked on the conductive layer for electromagnetic shielding, and
    the concave portion is formed from the concave part and the opening, and
    the conductive layer for electromagnetic shielding is provided near a part of the joining portion of the first member and the second member through which the electrical connection means is passed.

2. The semiconductor device according to claim 1, wherein the conductive layer for electromagnetic shielding is provided to at least one member of the first member and the second member, and is in parallel with a surface of the joining portion to the other member.

3. The semiconductor device according to claim 1, wherein the conductive layer for electromagnetic shielding is provided to at least one member of the first member and the second member, and is on a side farther away from the other member than the joining portion to the other member.

4. The semiconductor device according to claim 1, wherein the conductive layer for electromagnetic shielding is embedded in at least one member of the first member and the second member.

5. The semiconductor device according to claim 1, wherein the conductive layer for electromagnetic shielding is provided to the at least one member of the first member and the second member comprising the concave portion, and is in a periphery of the concave portion.

6. The semiconductor device according to claim 5,
    wherein a first conductive layer is formed on a top surface or on a bottom surface of the concave portion, and a second conductive layer is formed on an inner peripheral wall surface of the concave portion, and
    the first conductive layer, the second conductive layer, and the conductive layer for electromagnetic shielding are in conduction with one another.

7. A microphone, wherein a microphone chip is used as the sensor of the semiconductor device of claim 1, and an acoustic perforation is provided on one member of the first member and the second member.

* * * * *